US012148831B2

(12) United States Patent
Huang et al.

(10) Patent No.: US 12,148,831 B2
(45) Date of Patent: *Nov. 19, 2024

(54) SEMICONDUCTOR DEVICE AND A METHOD FOR FABRICATING THE SAME

(71) Applicant: TAIWAN SEMICONDUCTOR MANUFACTURING COMPANY, LTD., Hsinchu (TW)

(72) Inventors: Yu-Lien Huang, Jhubei (TW); Meng-Chun Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 163 days.

This patent is subject to a terminal disclaimer.

(21) Appl. No.: 17/833,833

(22) Filed: Jun. 6, 2022

(65) Prior Publication Data

US 2022/0302300 A1    Sep. 22, 2022

Related U.S. Application Data

(60) Continuation of application No. 16/939,655, filed on Jul. 27, 2020, now Pat. No. 11,355,638, which is a (Continued)

(51) Int. Cl.
*H01L 21/00* (2006.01)
*H01L 21/768* (2006.01)
(Continued)

(52) U.S. Cl.
CPC ...... *H01L 29/785* (2013.01); *H01L 21/76831* (2013.01); *H01L 21/76897* (2013.01);
(Continued)

(58) Field of Classification Search
CPC ............. H01L 29/785; H01L 21/76831; H01L 21/76897; H01L 21/823475
See application file for complete search history.

(56) References Cited

U.S. PATENT DOCUMENTS 6,380,075 B1 * 4/2002 Cabral, Jr. ........ H01L 21/28556
438/653
6,773,985 B2   8/2004 Suh
(Continued)

FOREIGN PATENT DOCUMENTS

CN   102244098 A   11/2011
CN   103311124 A   9/2013
(Continued)

OTHER PUBLICATIONS

Notice of Allowance dated Sep. 21, 2018, issued in parent U.S. Appl. No. 15/485,606.
(Continued)

*Primary Examiner* — Nicholas J Tobergte
(74) *Attorney, Agent, or Firm* — STUDEBAKER & BRACKETT PC

(57) ABSTRACT

A semiconductor device includes a substrate provided with an electronic device, an interlayer dielectric (ILD) layer formed over the electronic device, a wiring pattern formed on the ILD layer and a contact formed in the ILD layer and physically and electrically connecting the wiring pattern to a conductive region of the electronic device. An insulating liner layer is provided on sidewalls of the contact between the contact and the ILD layer. A height of the insulating liner layer measured from a top of the conductive region of the electronic device is less than 90% of a height of the contact measured between the top of the conductive region and a level of an interface between the ILD layer and the wiring pattern.

20 Claims, 24 Drawing Sheets

Related U.S. Application Data continuation of application No. 16/206,827, filed on Nov. 30, 2018, now Pat. No. 10,727,347, which is a division of application No. 15/485,606, filed on Apr. 12, 2017, now Pat. No. 10,164,106.

(60) Provisional application No. 62/440,135, filed on Dec. 29, 2016.

(51) Int. Cl.

| | |
|---|---|
| *H01L 21/8234* | (2006.01) |
| *H01L 23/485* | (2006.01) |
| *H01L 27/088* | (2006.01) |
| *H01L 29/08* | (2006.01) |
| *H01L 29/417* | (2006.01) |
| *H01L 29/66* | (2006.01) |
| *H01L 29/78* | (2006.01) |
| *H01L 23/522* | (2006.01) |
| *H01L 23/532* | (2006.01) |

(52) U.S. Cl.
CPC .... *H01L 21/823475* (2013.01); *H01L 23/485* (2013.01); *H01L 27/0886* (2013.01); *H01L 29/0847* (2013.01); *H01L 29/41791* (2013.01); *H01L 29/66545* (2013.01); *H01L 29/66795* (2013.01); *H01L 29/7851* (2013.01); *H01L 21/76804* (2013.01); *H01L 21/823425* (2013.01); *H01L 23/5226* (2013.01); *H01L 23/53295* (2013.01)

(56) References Cited

U.S. PATENT DOCUMENTS

| | | | |
|---|---|---|---|
| 6,828,245 B2 | 12/2004 | Chang | |
| 7,026,829 B2 | 4/2006 | Tiemeijer | |
| 7,060,555 B2 | 6/2006 | Tanaka et al. | |
| 7,667,271 B2 | 2/2010 | Yu et al. | |
| 7,704,869 B2 | 4/2010 | La Tulipe, Jr. et al. | |
| 7,910,453 B2 | 3/2011 | Xu et al. | |
| 7,923,712 B2 | 4/2011 | Arnold et al. | |
| 8,377,779 B1 | 2/2013 | Wang | |
| 8,399,931 B2 | 3/2013 | Liaw et al. | |
| 8,633,520 B2 | 1/2014 | Yu et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,742,574 B2 | 6/2014 | Samoilov et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,105,750 B1 | 8/2015 | Samoilov et al. | |
| 9,425,105 B1 | 8/2016 | Basker et al. | |
| 9,484,535 B1 | 11/2016 | Liu et al. | |
| 9,515,258 B2 | 12/2016 | Lin et al. | |
| 9,691,659 B1 | 6/2017 | Mignot et al. | |
| 9,985,026 B2 | 5/2018 | Chang et al. | |
| 10,164,106 B2 * | 12/2018 | Huang | H01L 29/0847 |
| 11,355,638 B2 * | 6/2022 | Huang | H01L 23/485 |
| 2001/0005636 A1 | 6/2001 | Nishizawa | |
| 2004/0084704 A1 | 5/2004 | Tang et al. | |
| 2004/0084746 A1 * | 5/2004 | Kim | H01L 21/28114 |
| | | | 257/E21.507 |
| 2009/0004856 A1 | 1/2009 | Kim et al. | |
| 2010/0029072 A1 | 2/2010 | Park et al. | |
| 2014/0001574 A1 | 1/2014 | Chen et al. | |
| 2014/0108533 A1 | 4/2014 | Falco et al. | |
| 2014/0110755 A1 | 4/2014 | Colinge | |
| 2014/0151812 A1 | 6/2014 | Liaw | |
| 2014/0312431 A1 | 10/2014 | Tsai et al. | |
| 2015/0187896 A1 | 7/2015 | Kamineni et al. | |
| 2016/0049394 A1 | 2/2016 | Shin et al. | |
| 2016/0093524 A1 | 3/2016 | Zumi et al. | |
| 2017/0141107 A1 * | 5/2017 | Kim | H01L 21/823431 |
| 2017/0162444 A1 | 6/2017 | Ok et al. | |
| 2018/0096887 A1 | 4/2018 | Mignot et al. | |
| 2018/0151556 A1 | 5/2018 | Choi et al. | |

FOREIGN PATENT DOCUMENTS

| | | |
|---|---|---|
| KR | 20090000324 A | 1/2009 |
| KR | 20100014192 A | 2/2010 |
| TW | 201120960 A | 6/2011 |
| TW | 201344805 A | 11/2013 |
| TW | 201603277 A | 1/2016 |
| TW | 201639161 A | 11/2016 |

OTHER PUBLICATIONS

Non-Final Office Action issued in U.S. Appl. No. 16/206,827, dated Oct. 25, 2019.
Notice of Allowance issued in U.S. Appl. No. 16/206,827, dated Mar. 25, 2020.
Non-Final Office Action issued in U.S. Appl. No. 16/939,655, dated Oct. 1, 2021.
Notice of Allowance issued in U.S. Appl. No. 16/939,655, dated Jan. 28, 2022.

* cited by examiner

SEMICONDUCTOR DEVICE AND A METHOD FOR FABRICATING THE SAME

CROSS-REFERENCE TO RELATED APPLICATIONS

This application is a continuation application of application Ser. No. 16/939,655 filed on Jul. 27, 2020, now U.S. Pat. No. 11,355,638, which is a continuation application of application Ser. No. 16/206,827 filed on Nov. 30, 2018, now U.S. Pat. No. 10,727,347, which is a divisional application of application Ser. No. 15/485,606 filed on Apr. 12, 2017, now U.S. Pat. No. 10,164,106, which claims the benefit of priority to U.S. Provisional Patent Application 62/440,135 filed Dec. 29, 2016, the entire disclosures of each of which are incorporated herein by reference.

TECHNICAL FIELD

The disclosure relates to a method for manufacturing a semiconductor device, and more particularly to a structure and a manufacturing method for a conductive layer over a gate, source/drain regions and/or a substrate.

BACKGROUND

With a decrease of dimensions of semiconductor devices, a separation or insulation between conductive layers becomes more important, while lowering resistance, for example, contact resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1A:
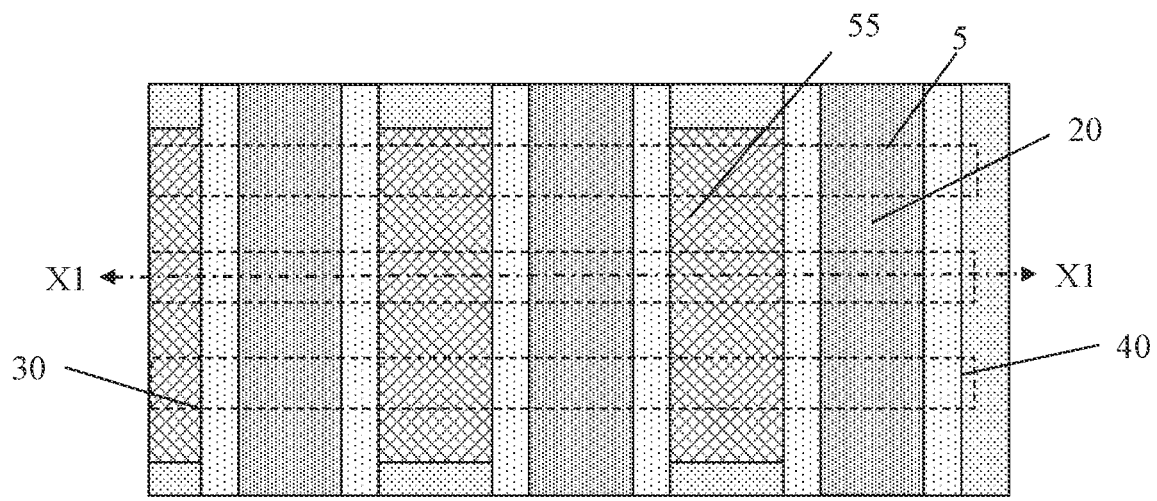
FIG. 1A shows a plan view (viewed from the above) illustrating one of the various stages of a sequential fabrication process of a semiconductor device according to some embodiments of the present disclosure.
Figure 1B:
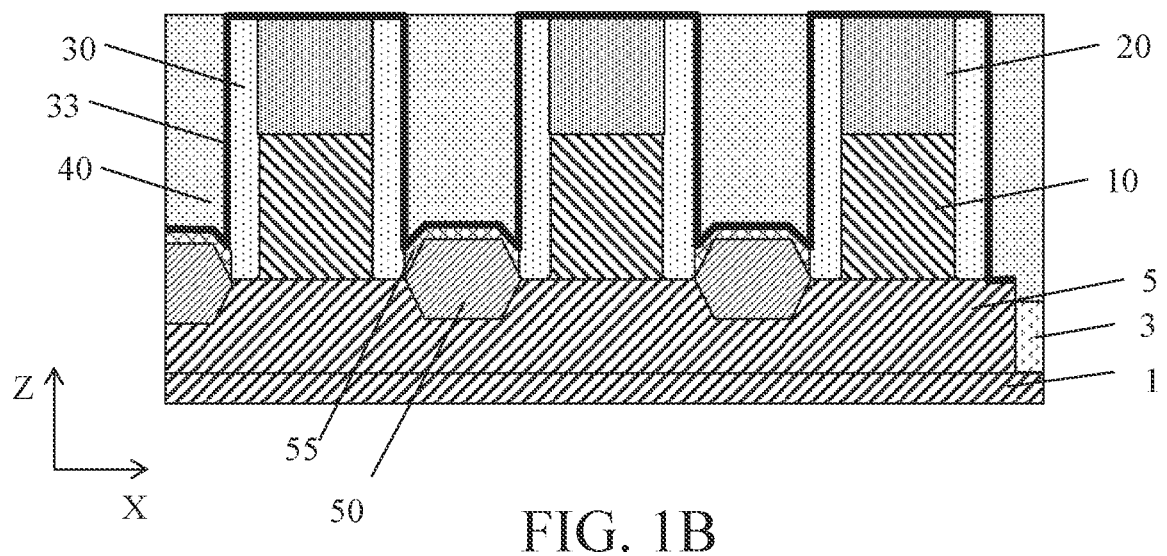
FIG. 1B shows a cross sectional view along line X1-X1 of FIG. 1A.

FIGS. 1A and 1B show one of the stages of a sequential semiconductor device fabrication process according to some embodiments of the present disclosure. FIG. 1A shows a plan (top) view and FIG. 1B shows a cross sectional view along line X1-X1 of FIG. 1A.

Figure 2:
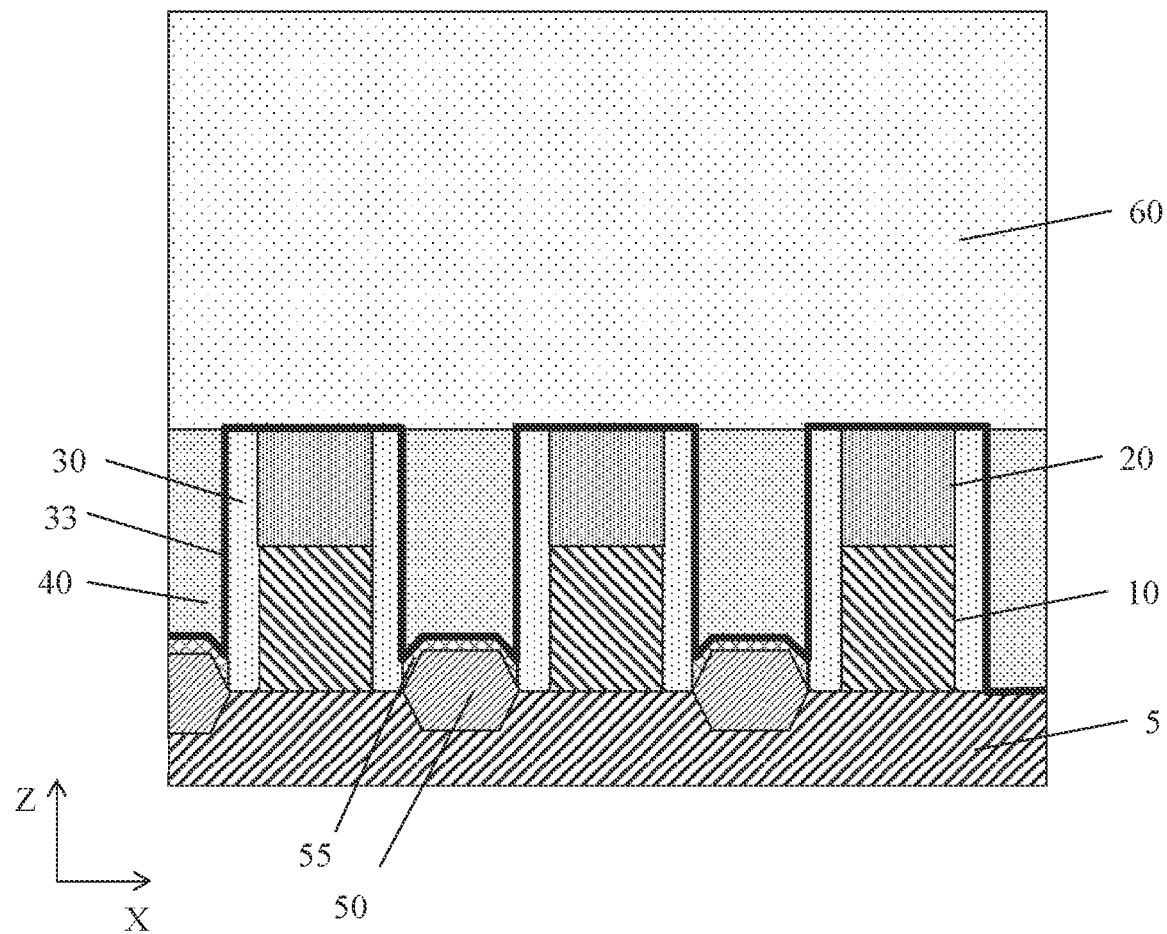
FIG. 2 shows a cross sectional view corresponding to line X1-X1 of FIG. 1A illustrating one of the various stages of a sequential semiconductor device fabrication process according to some embodiment of the present disclosure.

FIGS. 1A and 1B show a structure of a semiconductor device after source/drain and metal gate structures are formed. In FIGS. 1A and 1B, metal gate structures 10 are formed over a channel layer, for example, a part of fin structures 5, and cap insulating layers 20 are disposed over the metal gate structures 10, respectively. The fin structures 5 are disposed over a substrate 1 and protrude from an isolation insulating layer 3 (e.g., shallow trench isolation (STI)). In FIG. 1A, three fin structures 5 are disposed. However, the number of the fin structures is not limited to three. In FIG. 2 and thereafter, the substrate 1 and the isolation insulating layer 3 are omitted, unless expressly indicated.

The thickness of the metal gate structures 10 is in a range from about 10 nm to about 100 nm in some embodiments. The thickness of the cap insulating layer 20 is in a range from about 10 nm to about 30 nm in some embodiments, and is in a range from about 15 nm to about 20 nm in other embodiments. In some embodiments, a cap insulating layer is not formed on the metal gate structure 10.

Sidewall spacers 30 are provided on opposing sidewalls of the metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 10 nm in other embodiments. The combination of the metal gate structure 10, the cap insulating layer 20 and sidewall spacers 30 may be collectively referred to as a gate structure. Further, source/drain (S/D) regions 50 are formed adjacent to the gate structures, and a contact etch stop layer (CESL) 33 is formed over the gate structure and the A/D regions 50. The film thickness of the CESL 33 is in a range from about 1 nm to about 20 nm in some embodiments. Spaces between the gate structures are filled with a first interlayer dielectric (ILD) layer 40. A silicide layer 55 is further formed on the S/D region 50 in some embodiments. In the present disclosure, a source and drain are interchangeably used and there is substantially no structural difference. The term "a source/drain" (an S/D) refers to one of a source and a drain. Further, the silicide layer 55 is treated as a part of the source and the drain.

The silicide layer 55 includes one or more of cobalt silicide (e.g., CoSi, CoSi$_2$, Co$_2$Si, Co$_2$Si, Co$_3$Si; collectively "Co silicide"), titanium silicide (e.g., Ti$_5$Si$_3$, TiSi, TiSi$_2$, TiSi$_3$, Ti$_6$Si$_4$; collectively "Ti silicide"), nickel silicide (e.g., Ni$_3$Si, Ni$_{31}$Si$_{12}$, Ni$_2$Si, Ni$_3$Si$_2$, NiSi, NiSi$_2$; collectively "Ni silicide"), copper silicide (e.g., Cu$_{17}$Si$_3$, Cu$_{56}$Si$_{11}$,Cu$_5$Si, Cu$_{33}$Si$_7$, Cu$_4$Si, Cu$_{19}$Si$_6$,Cu$_3$Si,Cu$_{87}$Si$_{13}$; collectively "Cu silicide"), tungsten silicide (W$_5$Si$_3$, WSi$_2$; collectively "W silicide"), and molybdenum silicide (Mo$_3$Si, Mo$_5$Si$_3$, MoSi$_2$; collectively "Mo silicide"), or any other suitable silicide material. In other embodiments, a silicide layer is not formed at thin point of the manufacturing process.

Figure 1C:
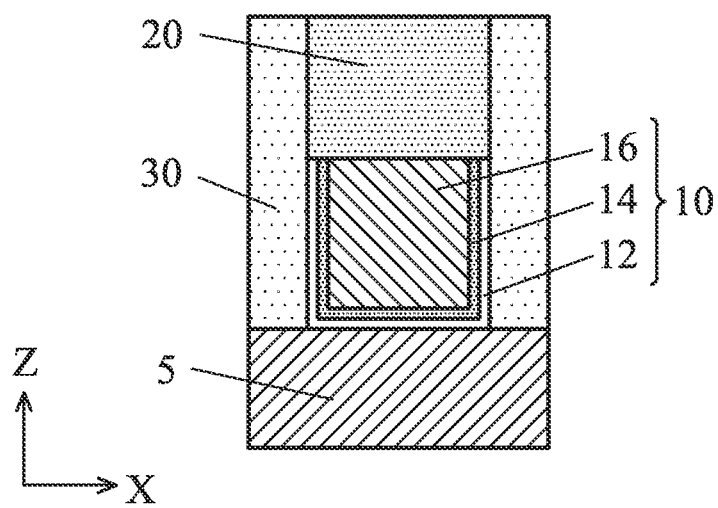
FIG. 1C is an enlarged view of the gate structure.

FIG. 1C is an enlarged view of the gate structure. The metal gate structure 10 includes one or more layers 16 of metal material, such as Al, Cu, W, Ti, Ta, TiN, TiAl, TiAlC, TiAlN, TaN, NiSi, CoSi, or any other suitable conductive materials. A gate dielectric layer 12 disposed between the channel layer 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof, or any other suitable dielectric material. In some embodiments, an interfacial layer made of SiO$_2$ having a 1-3 nm thickness is formed between the channel layer 5 and the high-k gate dielectric layer 12.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials, or any other suitable conducive material. For an n-channel FET, one or more of TaN, TaAlC, TiN, TiC, Co, TiAl, HfTi, TiSi and TaSi, or any other suitable conductive material is used as the work function adjustment layer, and for a p-channel FET, one or more of TiAlC, Al, TiAl, TaN, TaAlC, TiN, TiC and Co, or any other suitable conductive material is used as the work function adjustment layer.

The cap insulating layer 20 includes one or more layers of insulating material such as silicon nitride based material including SiN, SiON, SiCN and SiOCN, or any other suitable dielectric material. The sidewall spacer 30 is made of a same as or a different material than the cap insulating layer 20 and includes one or more layers of insulating material such as silicon nitride based material including SiN, SiON, SiCN and SiOCN, or any other suitable dielectric material. The CESL 33 is made of a same as or a different material than the cap insulating layer 20 and the sidewall spacers 30, and includes one or more layers of insulating material such as silicon nitride based material including SiN, SiON, SiCN and SiOCN, or any other suitable dielectric material. The first ILD layer 40 includes one or more layers of silicon oxide, SiOC, SiOCN or SiCN or other low-k materials, or porous materials, or any other suitable dielectric material. The first ILD layer 40 can be formed by LPCVD (low pressure chemical vapor deposition), plasma-CVD or other suitable film forming methods.

The material of the CESL 33, the sidewall spacer 30, the material of the cap insulating layer 20, and a material of the first ILD layer 40 may be different from each other, so that each of these layers can be selectively etched. In one embodiment, the CESL 33 is made of SiN, the sidewall spacer 30 is made of SiOCN, SiCN or SiON, the cap insulating layer 20 is made of SiN or SiON, and the first ILD 40 layer is made of SiO$_2$.

In this embodiment, fin field effect transistors (Fin FETs) fabricated by a gate-replacement process are employed. However, the technologies disclosed herein can be applied to other electronic devices, such as a planar FET, a gate-all-around FET, a multi-gate FET, a capacitor, a diode and a resistor.

Figure 1D:
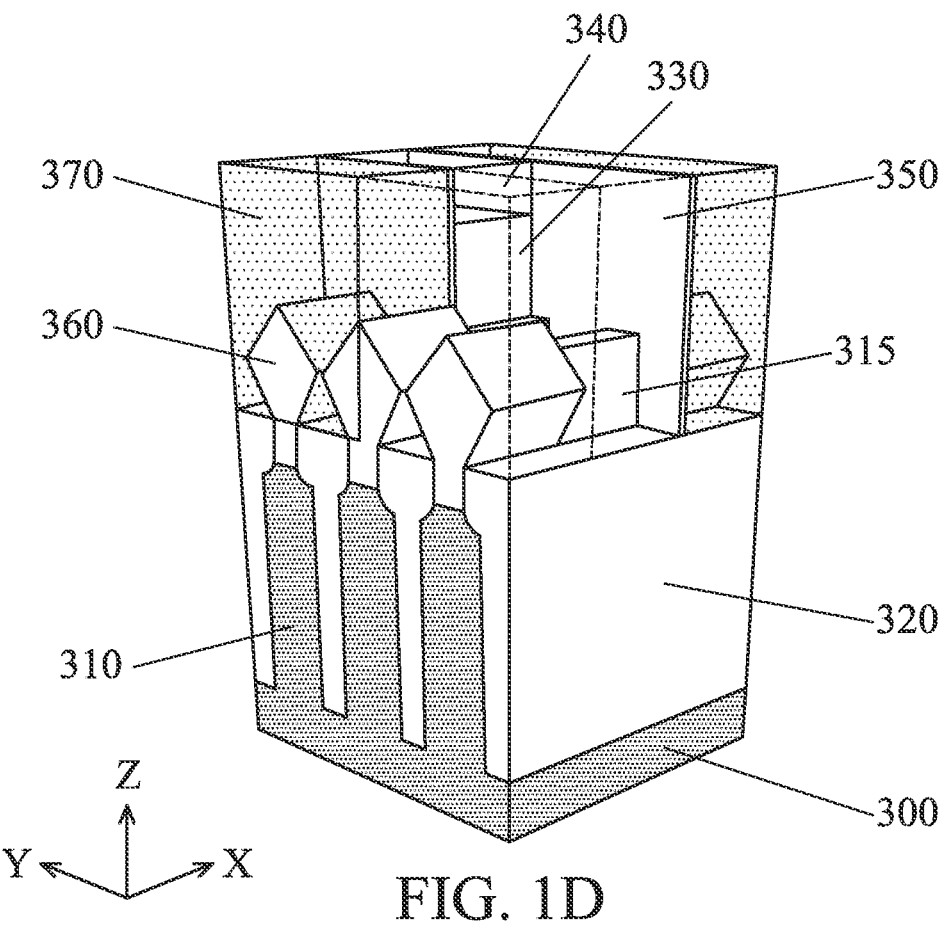
FIG. 1D shows a perspective view illustrating one of the various stages of a sequential fabrication process of a semiconductor device according to some embodiment of the present disclosure.

FIG. 1D shows a perspective view of a Fin FET structure. The Fin FET structure can be fabricated by the following operations.

First, a fin structure 310 is fabricated over a substrate 300. The fin structure includes a bottom region and an upper region as a channel region 315. The substrate is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP, or any other suitable semiconductor material; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD, plasma-CVD or flowable CVD. The isolation insulating layer may be formed by one or more layers of spin-on-glass (SOG), $SiO_2$, SiON, SiOCN and/or fluorine-doped silicate glass (FSG), or any other suitable dielectric material.

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. The ILD layer 370 includes one or more layers of silicon oxide, SiOC, SiOCN or SiCN or other low-k materials, or porous materials, or any other suitable dielectric material. After a planarization operation, the dummy gate structure is removed so as to make a gate space. Then, in the gate space, a metal gate structure 330 including a metal gate electrode and a gate dielectric layer, such as a high-k dielectric layer, is formed. Further, a cap insulating layer 340 is formed over the metal gate structure 330, so as to obtain the Fin FET structure shown in FIG. 1D. In FIG. 1D, parts of the metal gate structure 330, the cap insulating layer 340, sidewalls 330 and the ILD 370 are cut to show the underlying structure. In some embodiments, the adjacent source/drain epitaxial regions 360 are merged with each other, and a silicide layer is formed on the merged source/drain regions. In other embodiments, the adjacent source/drain epitaxial regions 360 are not merged with each other and a silicide layer is formed on respective source/drain regions.

The metal gate structure 330, the cap insulating layer 340, sidewall spacers 350, source/drain 360 and the ILD 370 of FIG. 1D substantially correspond to the metal gate structures 10, cap insulating layers 20, sidewall spacers 30, source/drain regions 50 and first interlayer dielectric layer (ILD) 40, of FIGS. 1A and 1B, respectively.

FIGS. 2-8 show exemplary cross sectional views corresponding to line X1-X1 of FIG. 1A, illustrating various stages of the sequential fabrication process of a semiconductor device according to some embodiments of the present disclosure. It is understood that additional operations can be provided before, during, and after the processes shown by FIGS. 2-8, and some of the operations described below can be replaced or eliminated for additional embodiments of the method. The order of the operations/processes may be interchangeable.

As shown in FIG. 2, a second ILD layer 60 is formed over the structure of FIG. 1B. The material and forming process are similar to those of the first ILD layer 40. In some embodiments, a contact etch stop layer (CESL) (not shown) made by, for example, SiN, SiC or SiCN, is formed between the first ILD layer 40 and the second ILD layer 60. The thickness of the second ILD layer 60 is in a range from about 10 nm to about 150 nm in some embodiments.

Figure 3:
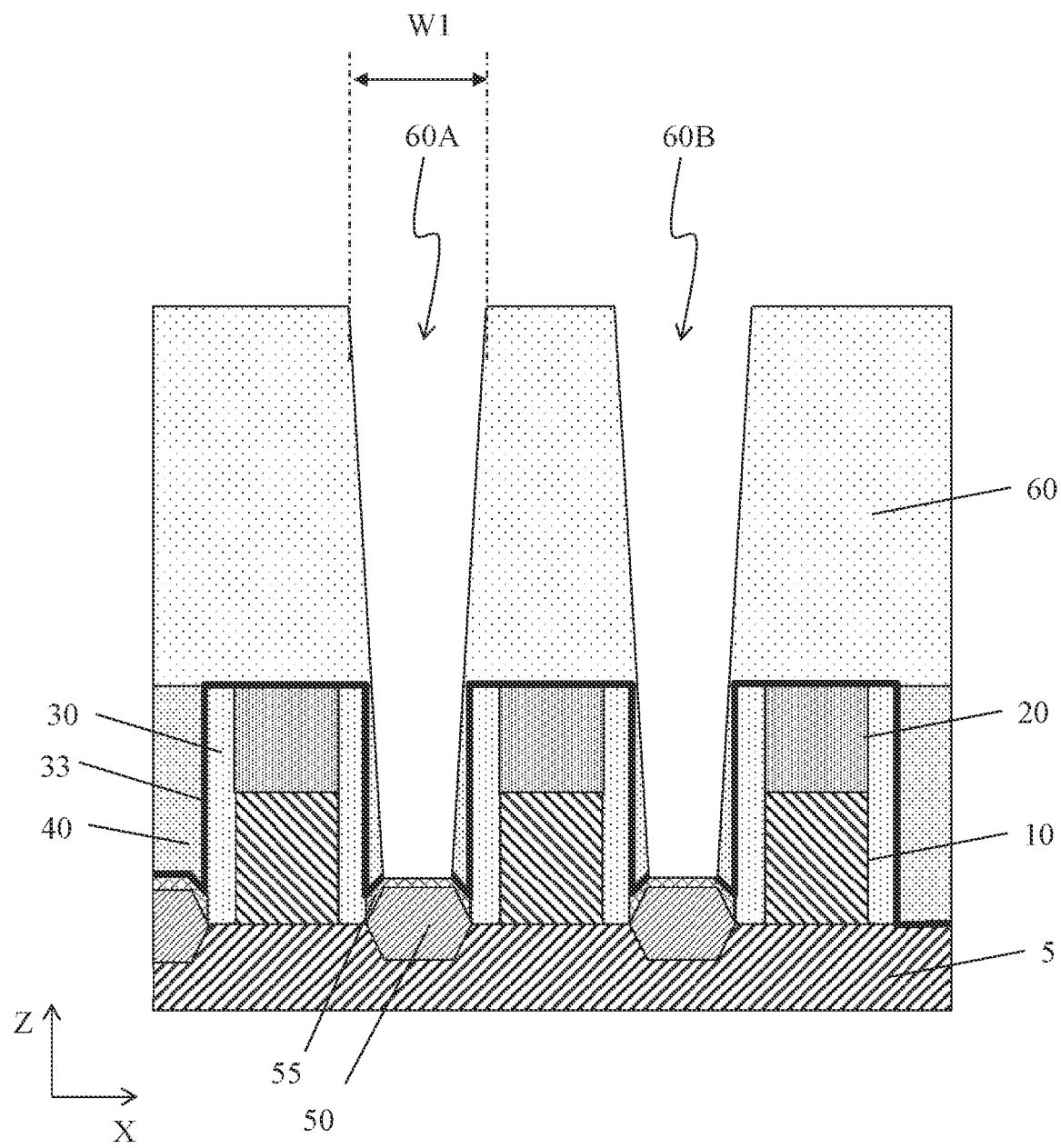
FIG. 3 shows a cross sectional view corresponding to line X1-X1 of FIG. 1A illustrating one of the various stages of a sequential semiconductor device fabrication process according to some embodiments of the present disclosure.

Then, as shown in FIG. 3, contact openings (holes) 60A and 60B are formed in the first and second ILD layers so as to at least partially expose the upper surfaces of the silicide layers 55 of the S/D regions. The contact openings 60A and 60B are formed by using one or more lithography operations and one or more etching operations. A photo resist pattern and/or a hard mask pattern is used in the etching operations. A width W1 of the contact openings as etched is in a range of about 10 nm to about 30 nm in some embodiments.

In some embodiments, the etching (e.g., dry etching) does not substantially etch the ESL layer 33 and only the first and second ILD layers are etched, and then an additional etching process to remove the ESL layer 33 on the silicide layers 55 is performed. In some embodiments, the contact openings 60A and 60B have a tapered shape having a top width wider than a bottom width.

Figure 4:
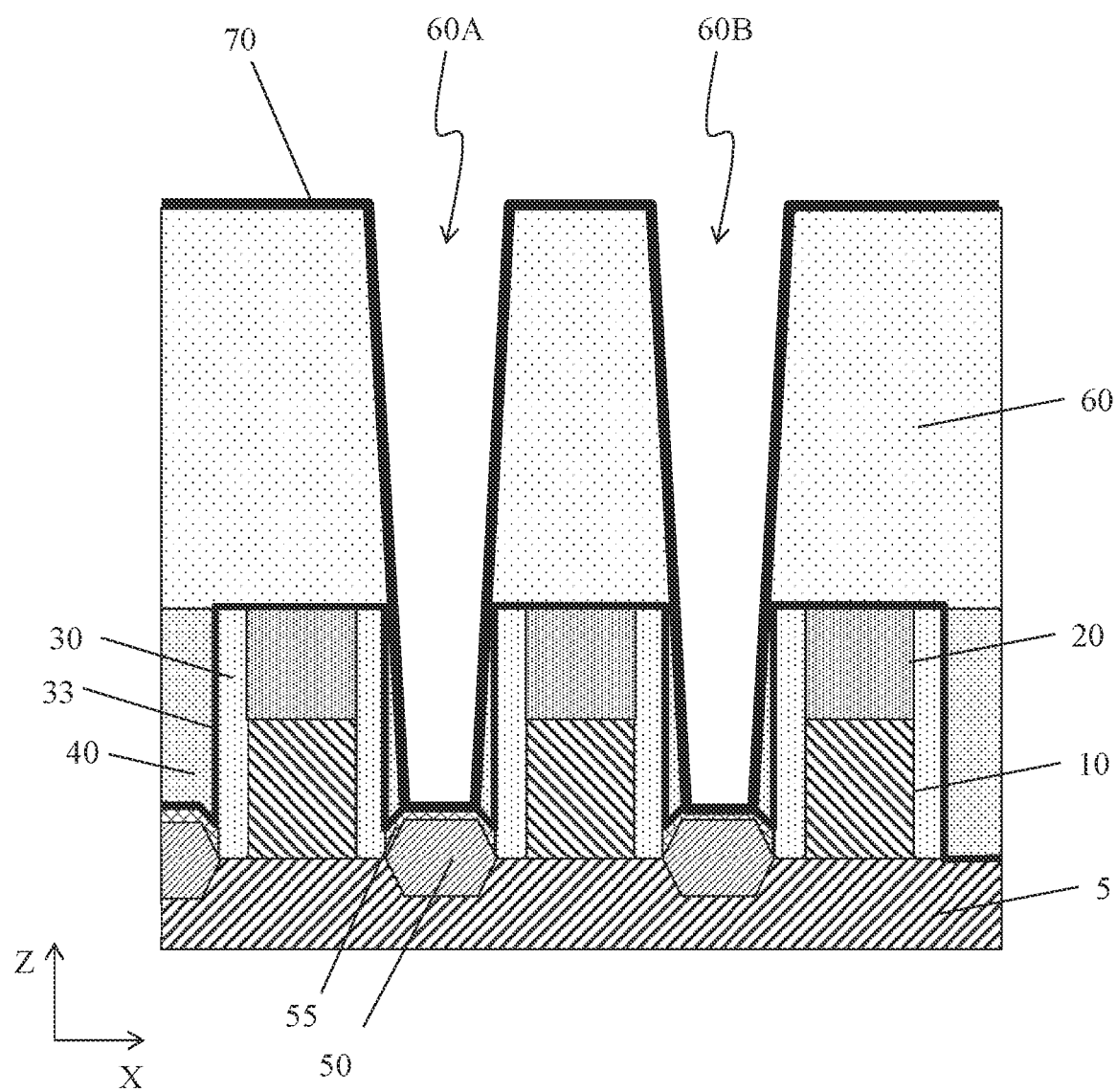
FIG. 4 shows a cross sectional view corresponding to line X1-X1 of FIG. 1A illustrating one of the various stages of a sequential semiconductor device fabrication process according to some embodiments of the present disclosure.

After the contact openings 60A and 60B are formed, an insulating liner layer 70 is conformally formed in the contact openings and the upper surface of the second ILD layer 60, as shown in FIG. 4. The insulating liner layer 70 may be formed by LPCVD, physical vapor deposition (PVD) including sputtering, or atomic layer deposition (ALD). The thickness of the insulating liner layer 70 is in a range from about 0.5 nm to about 10 nm in some embodiments, and is in a range from about 1 nm to about 5 nm in other embodiments.

The insulating liner layer 70 is made of one or more layers of SiN, SiON, SiCN, SiC, SiOCN or SiOC, or any other suitable dielectric material. In some embodiments, the insulating liner layer 70 is made of a dielectric material different from the first and second ILD layers. Other dielectric material, such as AlO, AlON or AlN may be used as the insulating material layer 70. In one embodiment, SiN is used. The exposed upper surface of the silicide layer 55 is covered by the insulating liner layer 70 in some embodiments.

As shown in FIG. 4, since the etching of the first ILD to form the contact openings does not fully remove the first ILD between two gate structures, a part of the first ILD layer 40 remains between the sidewall spacer 30 (or the ESL 33 on the sidewall spacer 30) and the insulating liner layer 70.

Figure 5:
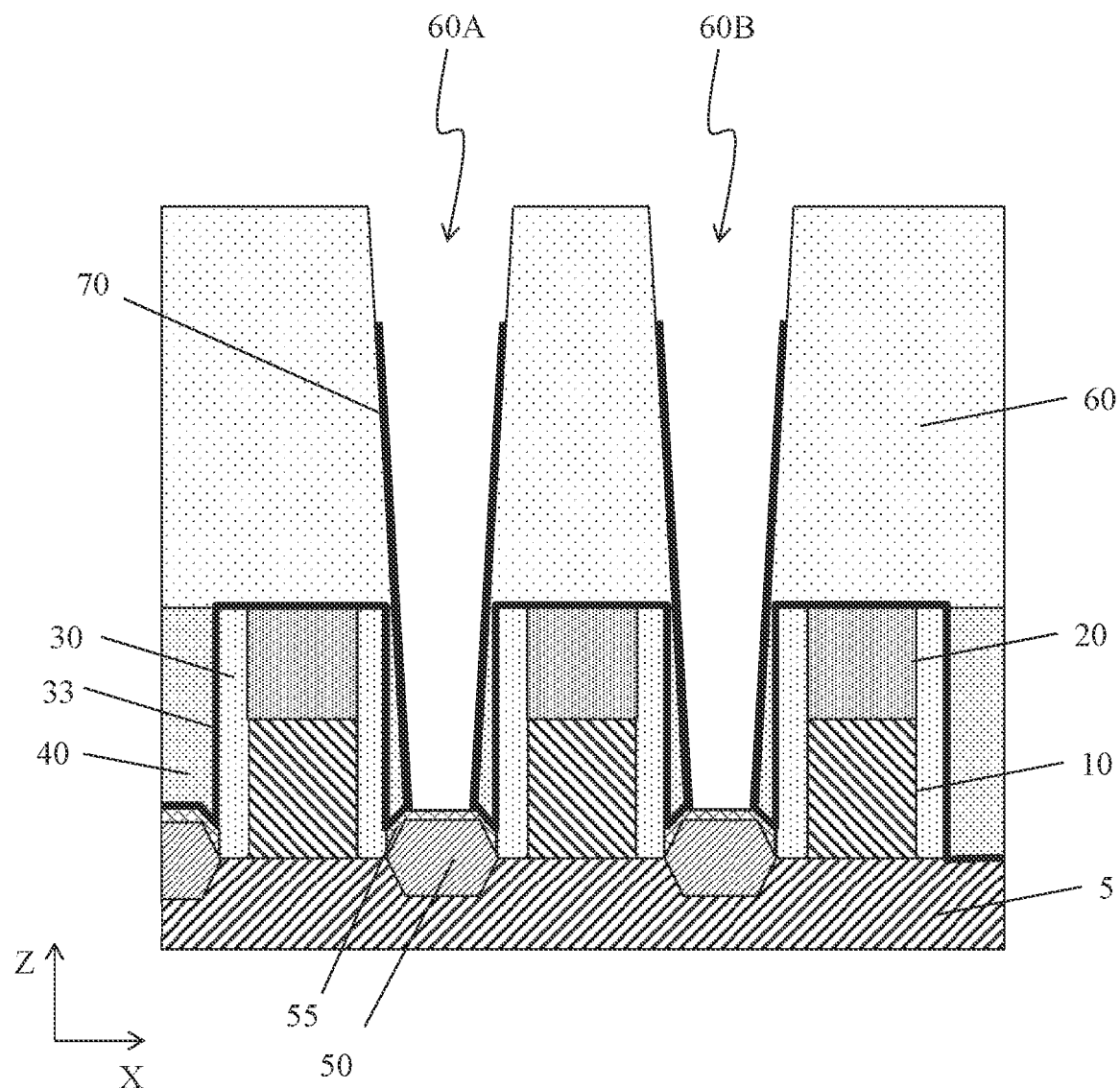
FIG. 5 shows a cross sectional view corresponding to line X1-X1 of FIG. 1A illustrating one of the various stages of a sequential semiconductor device fabrication process according to some embodiments of the present disclosure.

Subsequently, upper portions of the insulating liner layer 70 in the contact openings are partially removed by using an etching operation, as shown in FIG. 5. In some embodiments, about 10% or more in height of the insulating liner layer 70 formed in the contact openings are removed.

The insulating liner layer 70 formed on the upper surface of the second ILD layer 60 is also removed. In some embodiments, the insulating liner layer 70 formed on the upper surface of the second ILD layer 60 is fully removed, and in other embodiments, the insulating liner layer 70 formed on the upper surface of the second ILD layer 60 is partially removed and a thin insulating liner layer with a thickness of about 0.1 nm to 1 nm remains on the upper surface of the second ILD layer 60. Further, the insulating liner layer 70 covering the silicide layers 55 is also removed, thereby exposing the silicide layers 55.

In some embodiments, the etching operation includes an inductively coupled plasma (ICP) using source gases including hydrogen ($H_2$) gas and one or more fluorocarbon gases. The fluorocarbon gas includes one or more of $CF_4$, $CHF_3$, $CH_2F_2$, $CH_3F$, $CH_4F_6$ and $CH_4F_8$. The pressure in a plasma etching chamber is about 3 to about 500 mTorr in some embodiments. The RF power is about 10 W to about 2000 W and the bias voltage is about 50 V to about 600V, in some embodiments. The plasma etching may include two or more steps with different etching conditions.

Figure 6:
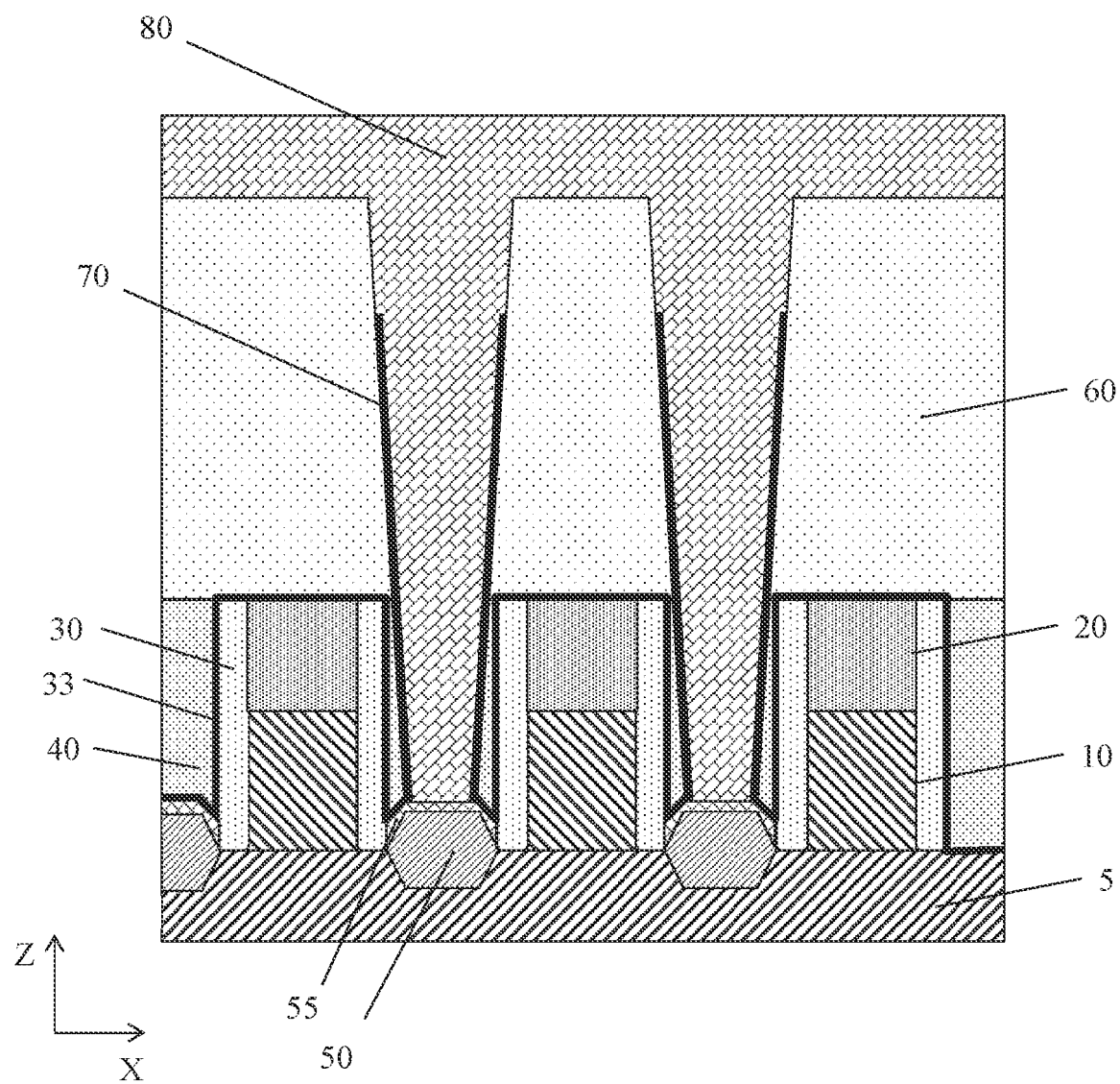
FIG. 6 shows a cross sectional view corresponding to line X1-X1 of FIG. 1A illustrating one of the various stages of a sequential semiconductor device fabrication process according to some embodiments of the present disclosure.

Subsequently, a conductive material layer 80 is formed in the contact openings 60A and 60B with the remaining insulating liner layers 70 and the upper surface of the second ILD layer 60, as shown in FIG. 6.

In some embodiments, the conductive material layer 80 includes a conformally formed layer of an adhesive (glue) layer and a body metal layer. The adhesive layer includes one or more layers of conductive materials. In some embodiments, the adhesive layer includes a TiN layer formed on a Ti layer. Any other suitable conductive material can be used. The thickness of each of the TiN and Ti layer is in a range from about 1 nm to about 5 nm in some embodiments. The adhesive layer can be formed by CVD, PVD, ALD, electro-plating or a combination thereof, or other suitable film forming methods. The adhesive layer is used to prevent the body metal layer from peeling off. In some embodiments, no adhesive layer is used and the body metal layer is directly formed in the contact openings. In such cases, the body metal layer is in direct contact with the silicide layers 55.

The body metal layer is one of Co, W, Mo and Cu, or any other suitable conductive material. In one embodiment, Cu is used as the body metal layer. The body metal layer can be formed by CVD, PVD, ALD, electro-plating or a combination thereof or other suitable film forming methods.

Figure 7:
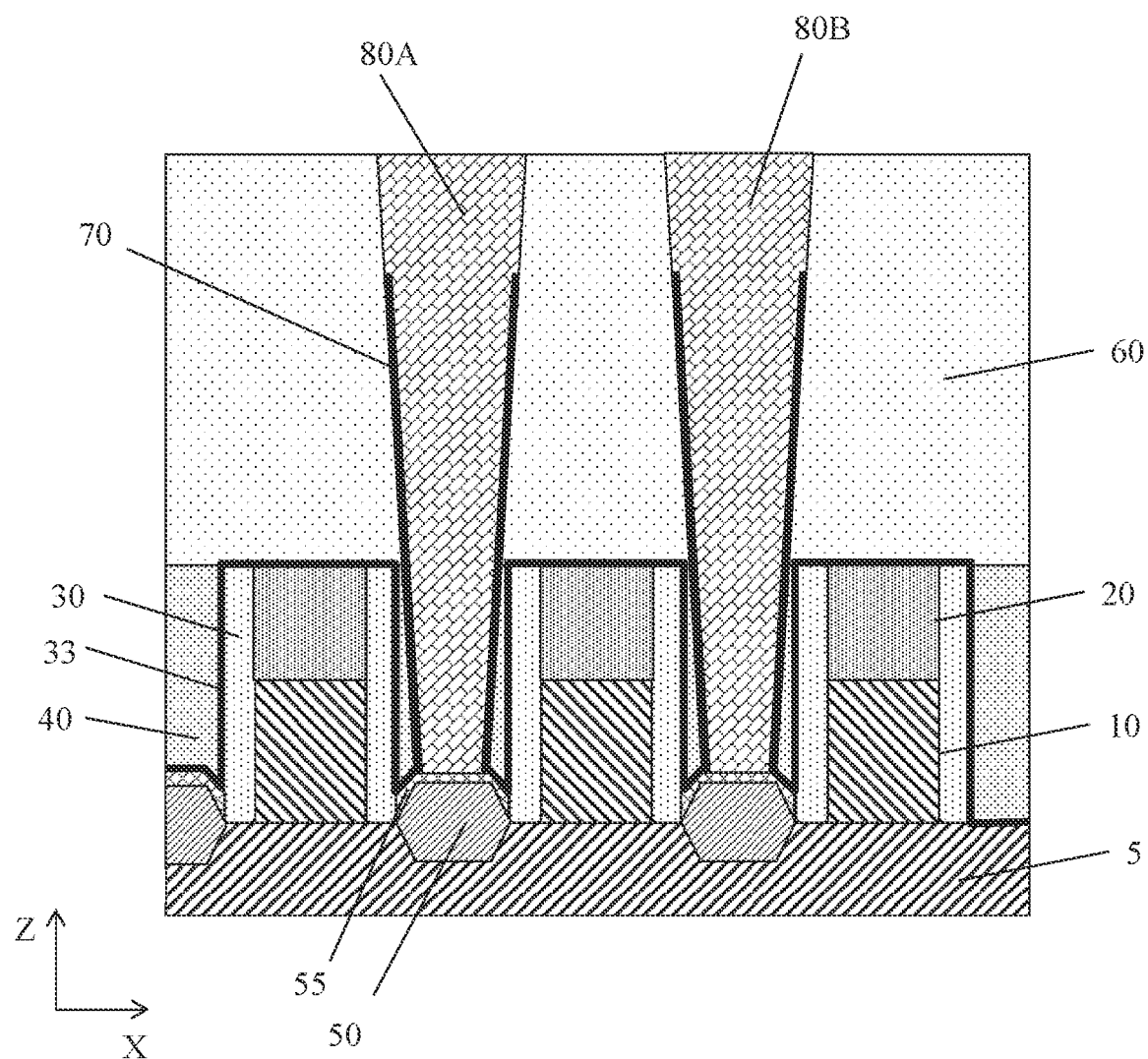
FIG. 7 shows a cross sectional view corresponding to line X1-X1 of FIG. 1A illustrating one of the various stages of a sequential semiconductor device fabrication process according to some embodiments of the present disclosure.

After the conductive material layer 80 is formed, a planarization operation, such as chemical mechanical polishing (CMP) or etch-back operations, is performed, thereby so as to remove the excess materials deposited on the upper surface of the second ILD layer 60, thereby forming contacts 80A and 80B, as shown in FIG. 7.

Figure 8:
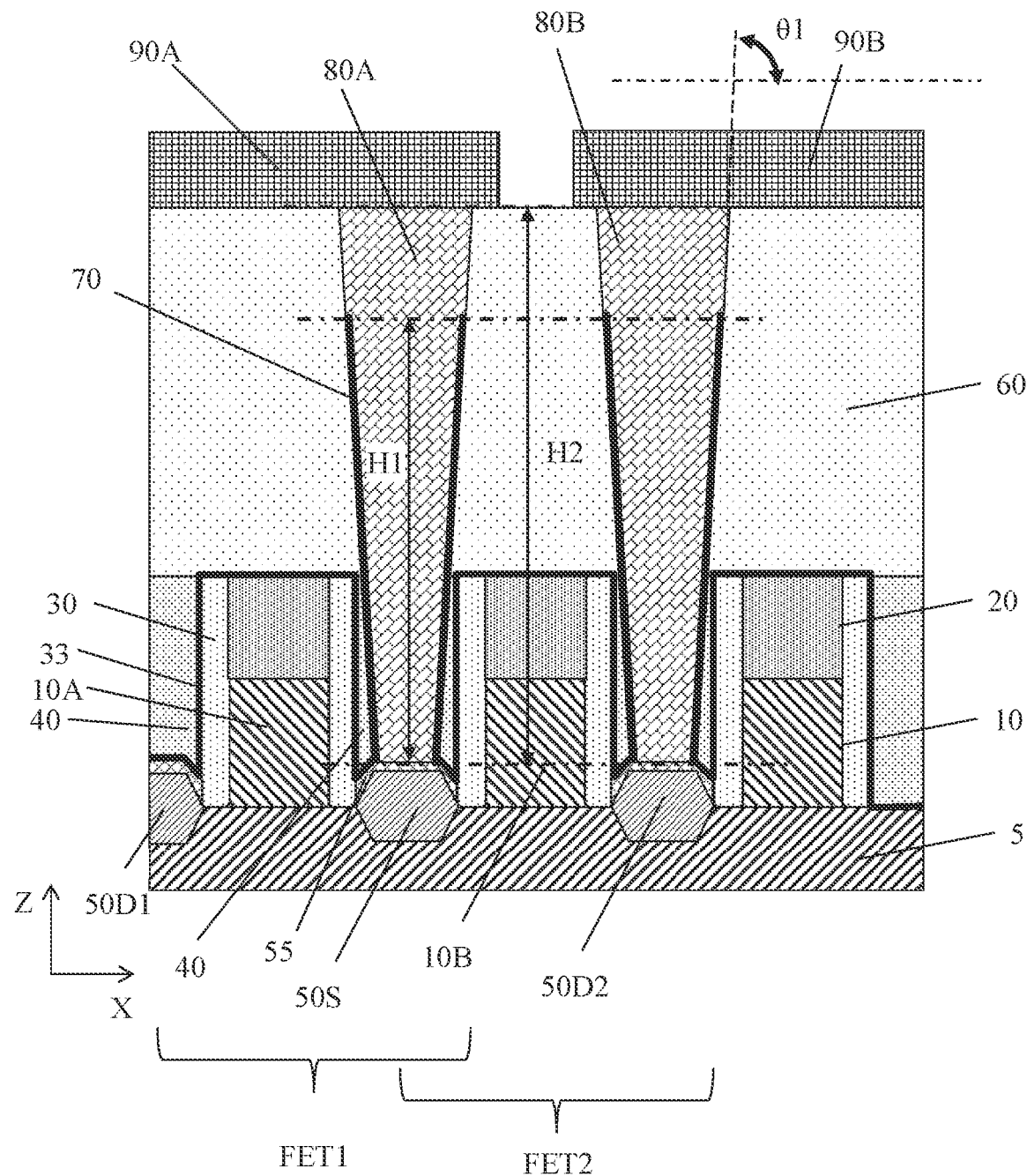
FIG. 8 shows a cross sectional view corresponding to line X1-X1 of FIG. 1A illustrating one of the various stages of a sequential semiconductor device fabrication process according to some embodiments of the present disclosure.

Subsequently, wiring patterns 90A and 90B are formed to contact with the contacts 80A and 80B, respectively, as shown in FIG. 8. The wiring patterns are made of one of Co, W, Mo and Cu, or any other suitable conductive material. In one embodiment, Cu is used as the wiring patterns. In some embodiments, the contacts and the wiring patterns are made by a dual damascene process. The wiring patterns may include vias connected to an upper conductive layer.

In some embodiments, as shown in FIG. 8, the semiconductor device includes a first FET (FinFET) FET1 having a first gate 10A, a first source (shared source) 50S and a first drain 50D1 and a second FET (FinFET) FET2 having a second gate 10B, a second source (the shared source) 50S and a second drain 50D2. The first contact 80A is in contact with the shared source 50S (via the silicide layer 55) and the second contact 80B is in contact with the drain 50D2 (via the silicide layer 55) of the second FET. In some embodiments, as shown in FIG. 9, a wiring pattern 90 is formed to contact both contacts 80A and 80B.

Figure 9:
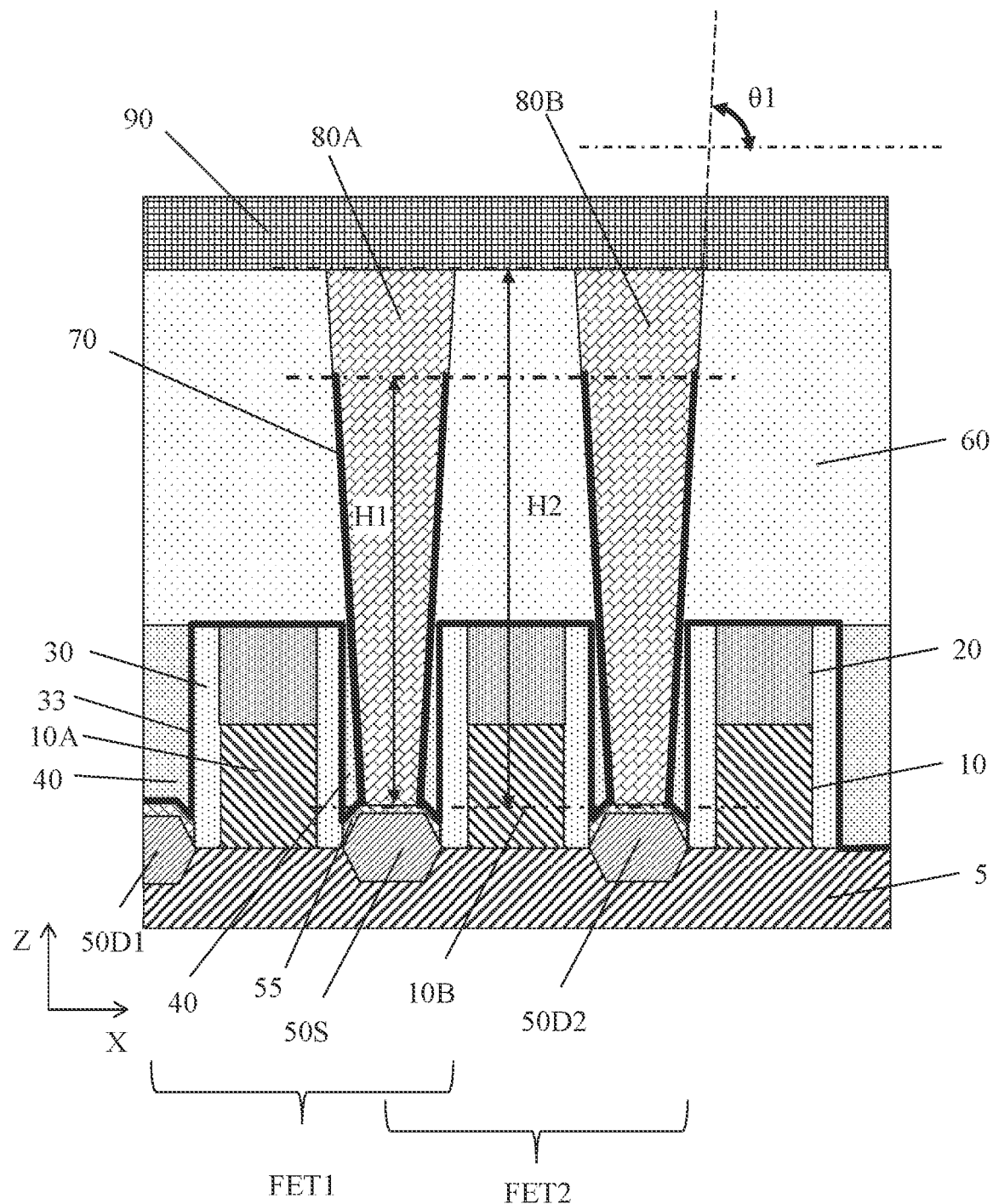
FIG. 9 shows a cross sectional view according to some embodiments of the present disclosure.

As shown in FIGS. 8 and 9, a height H1 of the insulating liner layer 70 measured from a top of the silicide layer 55 is less than 90% of a height H2 of the contact 80A or 80B measured between a level of the top of the silicide layer 55 region and a level of an interface between the second ILD layer 60 and the wiring pattern 90, 90A or 90B, in some embodiments. In other embodiments, H1 is less than 75% of H2.

The insulating liner layer 70 is used to provide a better isolation between the contact 80A, 80B and the metal gate electrodes 10. Accordingly, the top of the insulating liner layer 70 is located higher than a level of the top of the metal gate electrode 10. In some embodiments, the top of the insulating liner layer 70 is located higher than a level of the top of the gate cap insulating layer 20 and/or the sidewall spacers 30. In certain embodiments, the difference between the top of the insulating liner layer 70 and the level of the top of the gate, the gate cap insulating layer 20 and/or the sidewall spacers 30 is about 5 nm or more. As shown in FIGS. 8 and 9, the metal gate electrode 10 and the contact 80A are separated by at least the sidewall spacer 30, the CESL 33, the first ILD 40 and the insulating liner layer 70 in the X (horizontal) direction.

As shown in FIGS. 8 and 9, the sidewall of the contacts 80A and 80B contacting the second ILD 60 has a taper angle $\theta 1$ in the X directional cross section with respect to the line parallel to the surface of the substrate. The taper angle $\theta 1$ is equal to or greater than 85 degrees or more and less than 90 degrees in some embodiments. The line to measure the taper angle $\theta 1$ can be determined as the most fitted line along the entire sidewall of the contacts.

FIGS. 10-16 show exemplary cross sectional views according to other embodiments of the present disclosure. Material, configuration, dimensions and/or processes the same as or similar to the foregoing embodiments described with respect to FIGS. 1A-9 may be employed in the following embodiments, and detailed explanation thereof may be omitted.

Figure 10:
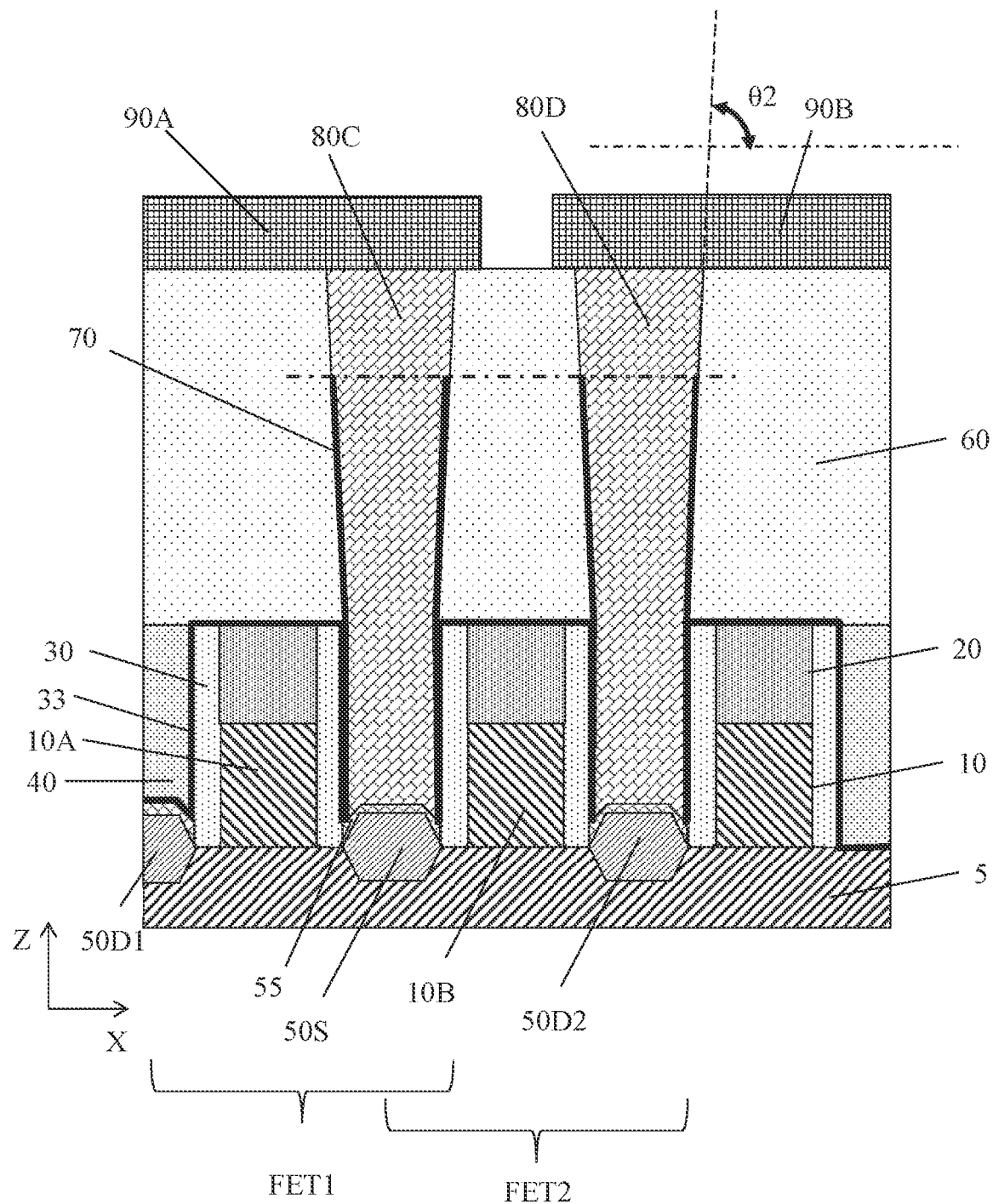
FIG. 10 shows a cross sectional view according to other embodiments of the present disclosure.

Referring to FIG. 10, in the contact opening etching as described with FIG. 3, the first ILD layer 40 around the contact openings 60A, 60B is removed more than the case of FIG. 3 or substantially fully removed, thereby the sidewall spacers 30 or the CESL 33 are exposed, in some embodiments. Accordingly, the insulating liner layer 70 is in direct contact with the exposed sidewall spacers 30 and/or the CESL 33, without interposing a part of the first ILD layer 40, as shown in FIG. 10. As shown in FIG. 10, the metal gate electrode 10 and the contact 80A are separated by at least the sidewall spacer 30, the CESL 33, and the insulating liner layer 70 in the X (horizontal) direction.

The first contact 80C is in contact with the shared source 50S (via the silicide layer 55) and connected to a wiring pattern 90A, and the second contact 80D is in contact with the drain 50D2 of the second FET and connected to a wiring pattern 90B. In some embodiments, the wiring patterns 90A and 90B are formed as one wiring pattern (connected).

In FIG. 10, the line to measure the taper angle $\theta 2$ of the contacts 80C and 80D can be determined as the most fitted line along the sidewall of the contacts 80C and 80D above the gate cap insulating layer 20. The taper angle θ2 is equal to or greater than 85 degrees or more and less than 90 degrees in some embodiments.

Figure 11:
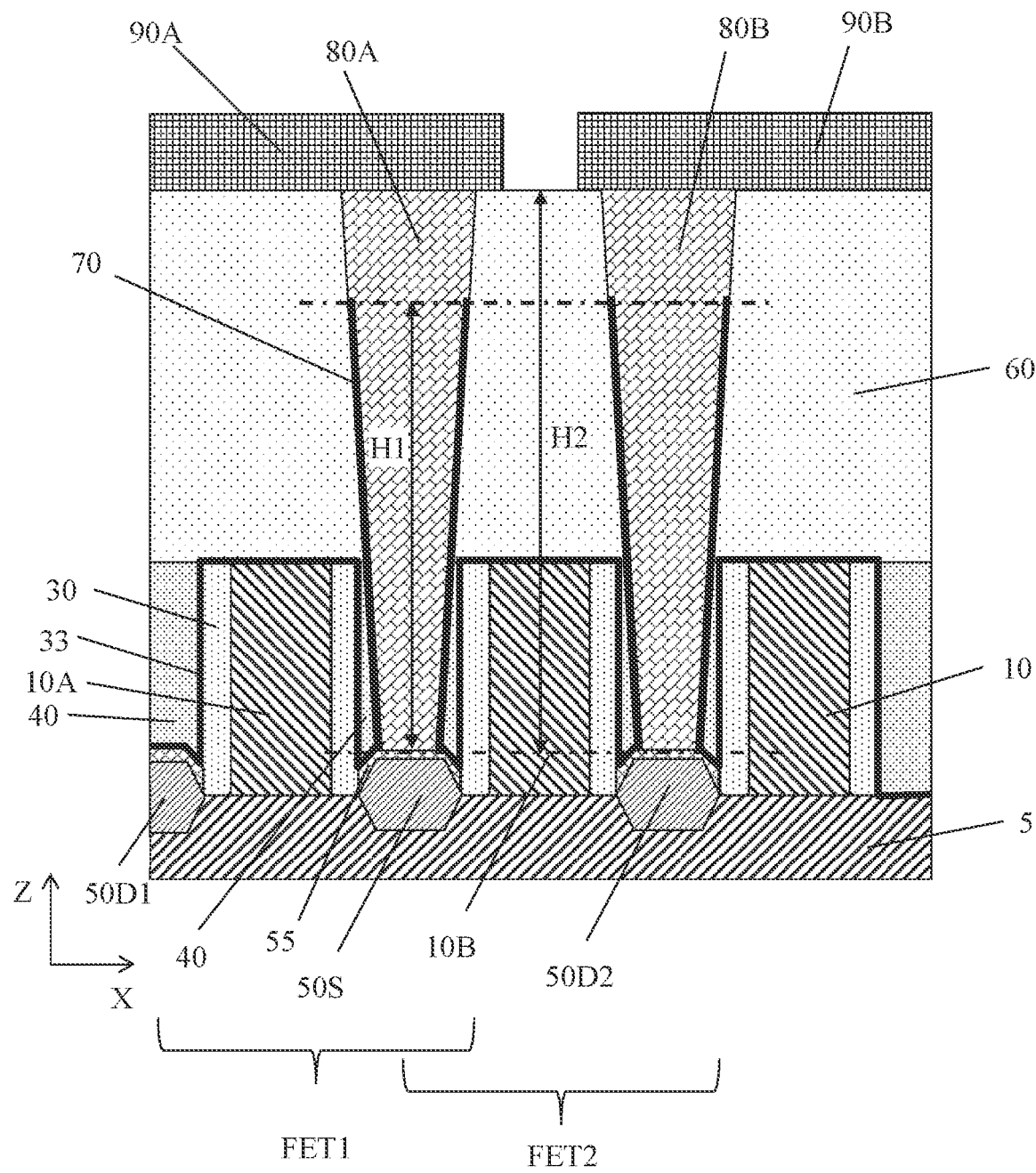
FIG. 11 shows a cross sectional view according to other embodiments of the present disclosure.
Figure 12:
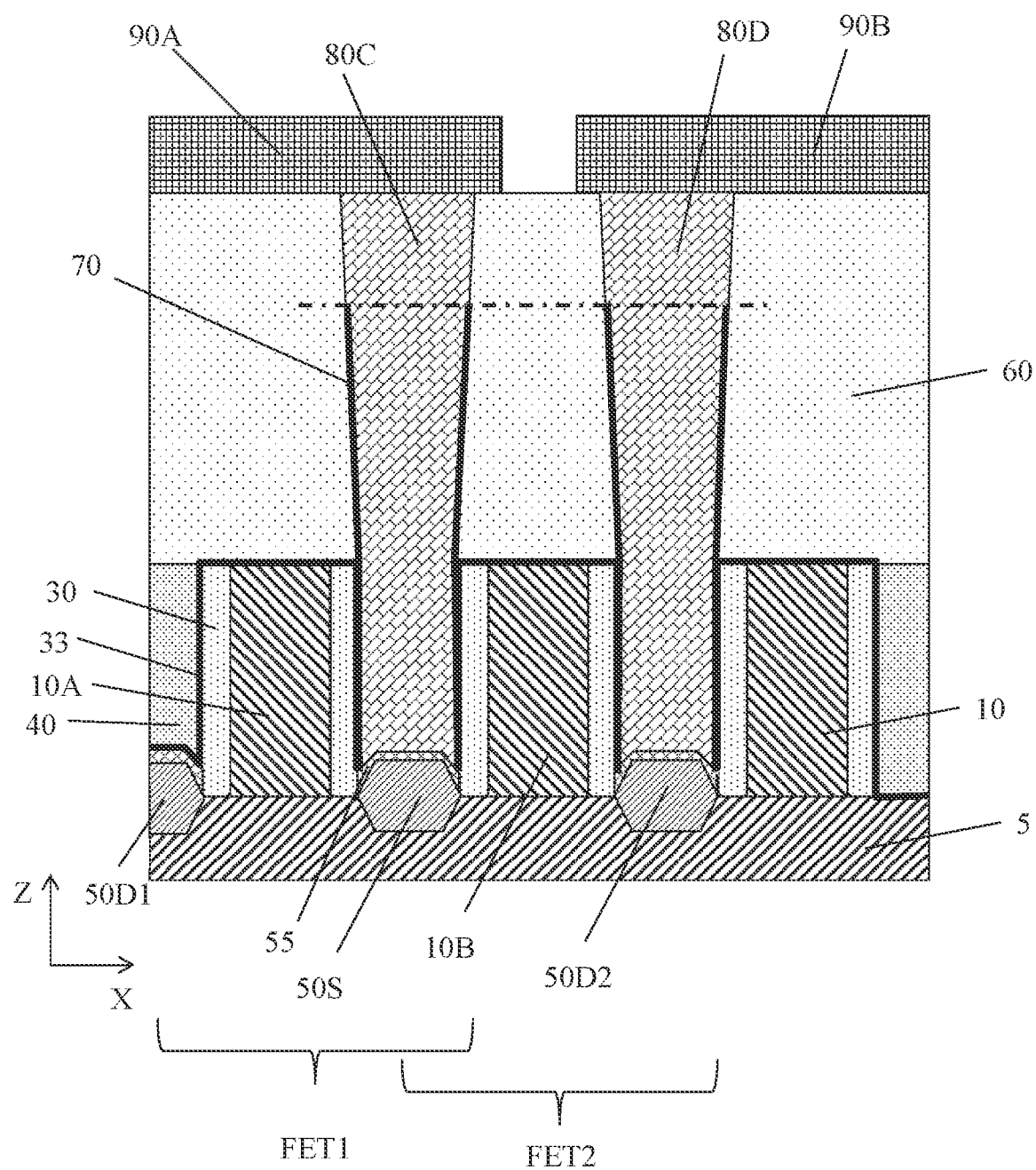
FIG. 12 shows a cross sectional view according to other embodiments of the present disclosure.

Referring to FIGS. 11 and 12, unlike the embodiments described with FIGS. 1A-10, in the embodiments of FIGS. 11 and 12, the gate structure has no gate cap insulating layer 20.

In some embodiments, the top of the insulating liner layer 70 is located higher than a level of the top of the metal gate electrode 10 and/or the sidewall spacers 30. In certain embodiments, the difference between the top of the insulating liner layer 70 and the level of the top of the metal gate electrode and/or the sidewall spacers 30 is about 10 nm or more. In FIG. 11, similar to FIG. 9, the metal gate electrode 10 and the contact 80A are separated by at least the sidewall spacer 30, the CESL 33, the first ILD 40 and the insulating liner layer 70 in the X (horizontal) direction. In FIG. 12, similar to FIG. 10, the metal gate electrode 10 and the contact 80A are separated by at least the sidewall spacer 30, the CESL 33, and the insulating liner layer 70 in the X (horizontal) direction, without interposing the first ILD layer 40 therebetween.

Figure 13:
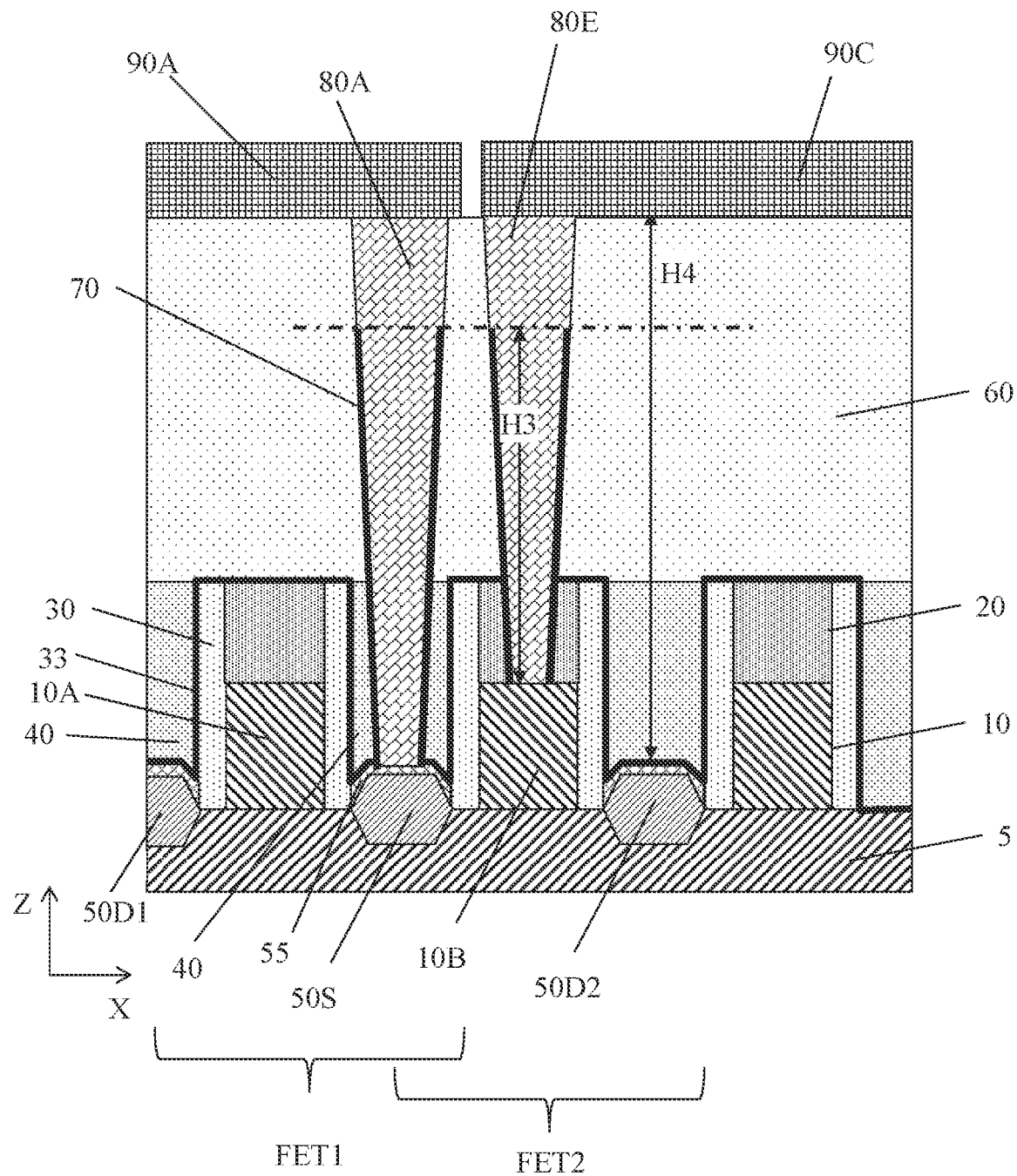
FIG. 13 shows a cross sectional view according to other embodiments of the present disclosure.

FIG. 13 shows a cross sectional view according to other embodiments of the present disclosure. In this embodiment, one contact 80A is formed in contact with a source (or a drain) of one FET and one contact 80E is formed in contact with a gate of the FET, as shown in FIG. 13. The first contact 80A is in contact with the shared source 50S (via the silicide layer 55) and connected to a wiring pattern 90A, and the second contact 80E is in contact with the gate 10B of the second FET and connected to a wiring pattern 90C. In some embodiments, the wiring patterns 90A and 90C are formed as one wiring pattern (connected).

As shown in FIG. 13, with respect to the contact 80E (a metal-to-gate contact), a height H3 of the insulating liner layer 70 measured from a top of the metal gate electrode 10B is less than 90% of a height H4 of the contact 80E measured between a level of the top of the metal gate electrode 10B and a level of an interface between the second ILD layer 60 and the wiring pattern 90A or 90C, in some embodiments. In other embodiments, H3 is less than 75% of H4.

Figure 14:
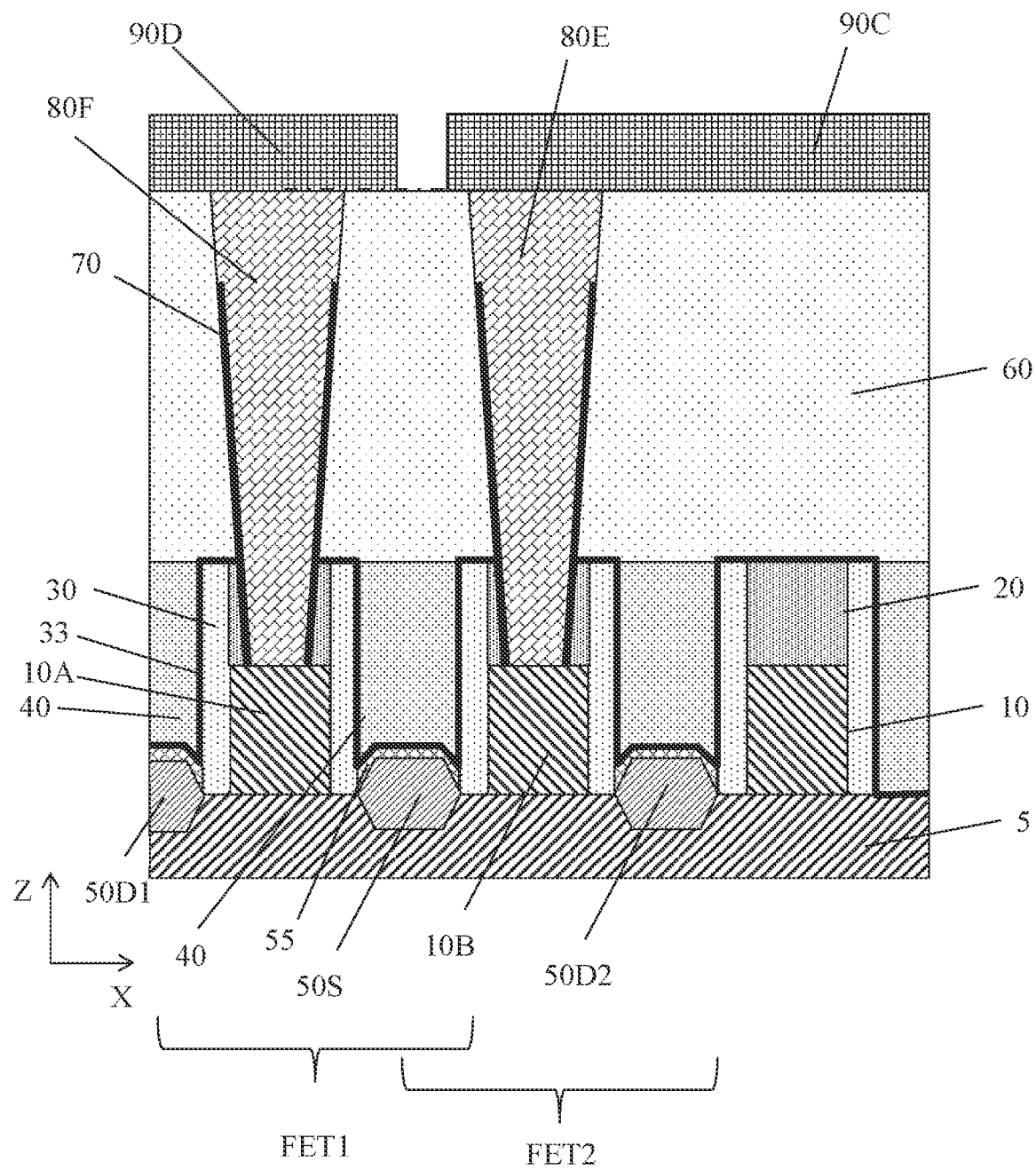
FIG. 14 shows a cross sectional view according to other embodiments of the present disclosure.

FIG. 14 shows a cross sectional view according to other embodiments of the present disclosure. In this embodiment, one contact 80E is formed in contact with a gate of one FET FET2 and one contact 80F is formed in contact with a gate of another FET FET1, as shown in FIG. 14. The first contact 80F is in contact with the gate 10A and connected to a wiring pattern 90D, and the second contact 80E is in contact with the gate 10B of the FET2 and connected to a wiring pattern 90C. In some embodiments, the wiring patterns 90D and 90C are formed as one wiring pattern (connected).

Figure 15:
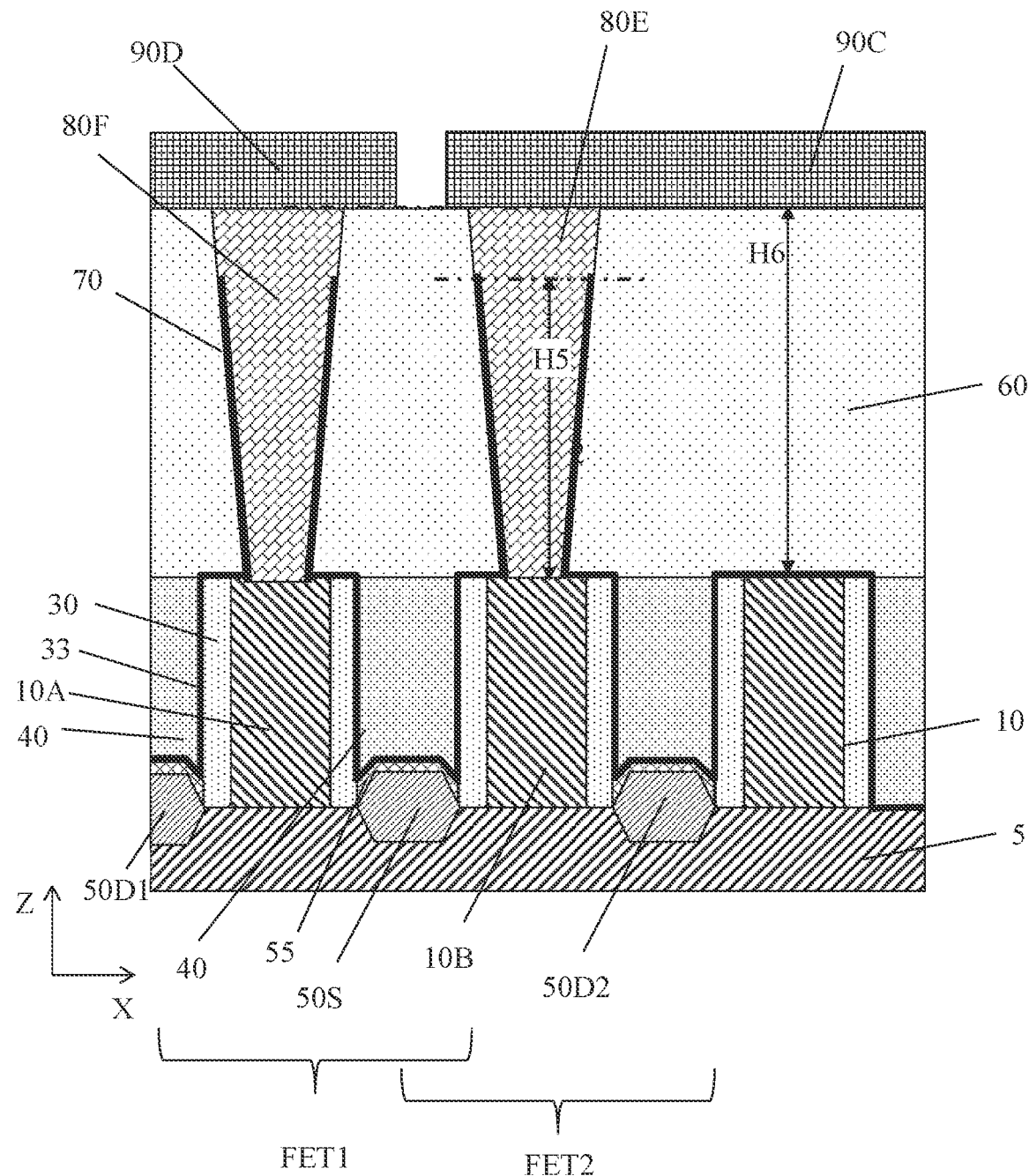
FIG. 15 shows a cross sectional view according to other embodiments of the present disclosure.

FIG. 15 shows a cross sectional view according to other embodiments of the present disclosure. In this embodiment, no gate cap insulating layers are formed. One contact 80E is formed in contact with a gate of one FET FET2 and one contact 80F is formed in contact with a gate of another FET FET1, as shown in FIG. 15. The first contact 80F is in contact with the gate 10A and connected to a wiring pattern 90D, and the second contact 80E is in contact with the gate 10B of the FET2 and connected to a wiring pattern 90C. In some embodiments, the wiring patterns 90D and 90C are formed as one wiring pattern (connected).

As shown in FIG. 15, with respect to the contact 80F, a height H5 of the insulating liner layer 70 measured from a top of the metal gate electrode 10B is less than 90% of a height H6 of the contact 80F measured between a level of the top of the metal gate electrode 10B and a level of an interface between the second ILD layer 60 and the wiring pattern 90C or 90D, in some embodiments. In other embodiments, H5 is less than 75% of H6.

Figure 16:
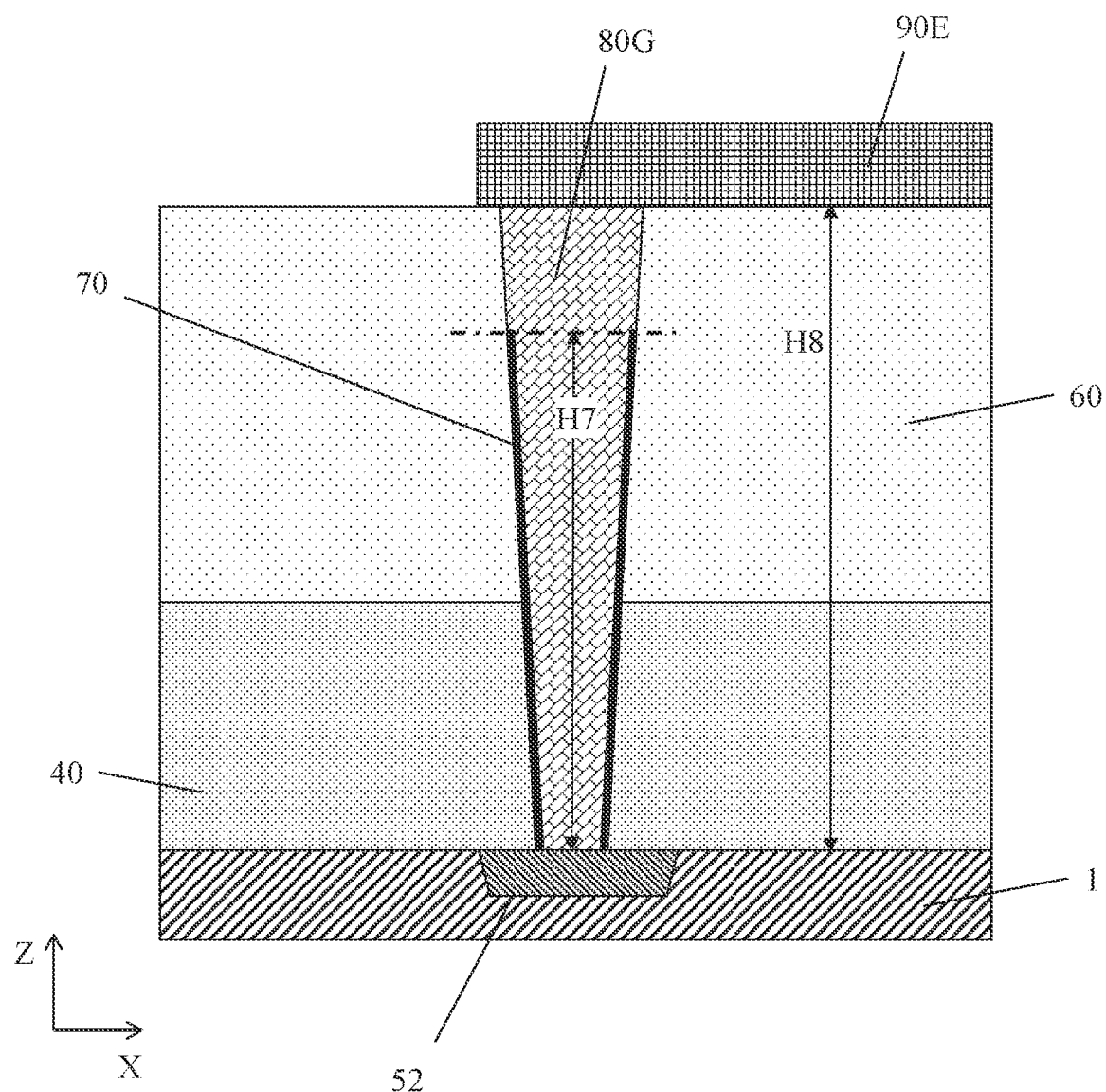
FIG. 16 shows a cross sectional view according to other embodiments of the present disclosure.

FIG. 16 shows a cross sectional view according to another embodiment of the present disclosure. In this embodiment, a contact 80G connects the wiring pattern 90E and a diffusion region 52 formed in the substrate 1. The wiring pattern 90E and the diffusion region 52 are used to provide a potential to the substrate 1 for, for example, FETs.

As shown in FIG. 16, with respect to the contact 80G (a metal-to-S/D contact), a height H7 of the insulating liner layer 70 measured from a top of the diffusion region 52 is less than 90% of a height H8 of the contact 80G measured between a level of the top of the diffusion region 52 and a level of an interface between the second ILD layer 60 and the wiring pattern 90E, in some embodiments. In other embodiments, H7 is less than 75% of H8.

Figures 17A, 17B:
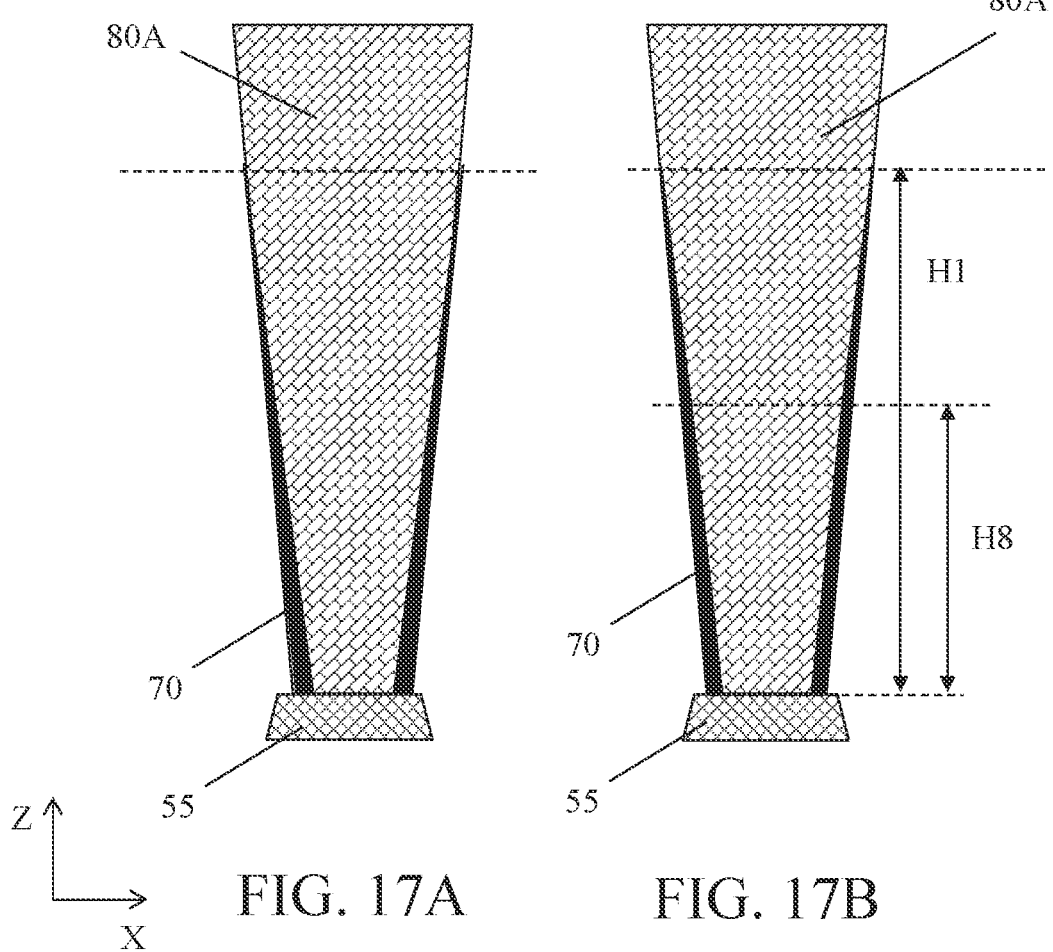
FIGS. 17A and 17B show exemplary cross sectional views according to some embodiments of the present disclosure.

FIGS. 17A and 17B show exemplary cross sectional views according to some embodiments of the present disclosure.

In the forgoing embodiments, the insulating liner layer 70 has a substantially uniform thickness from the bottom to the top. In some embodiments, as shown in FIG. 17A, the thickness of the insulating liner layer 70 gradually decreases from the bottom toward the top. In other embodiments, as shown in FIG. 17B, the thickness of the insulating liner layer 70 is substantially uniform from the bottom to a level H8 and then gradually decreases toward the top. In certain embodiments, H8 is about 10% to about 80% of H1.

Figure 18:
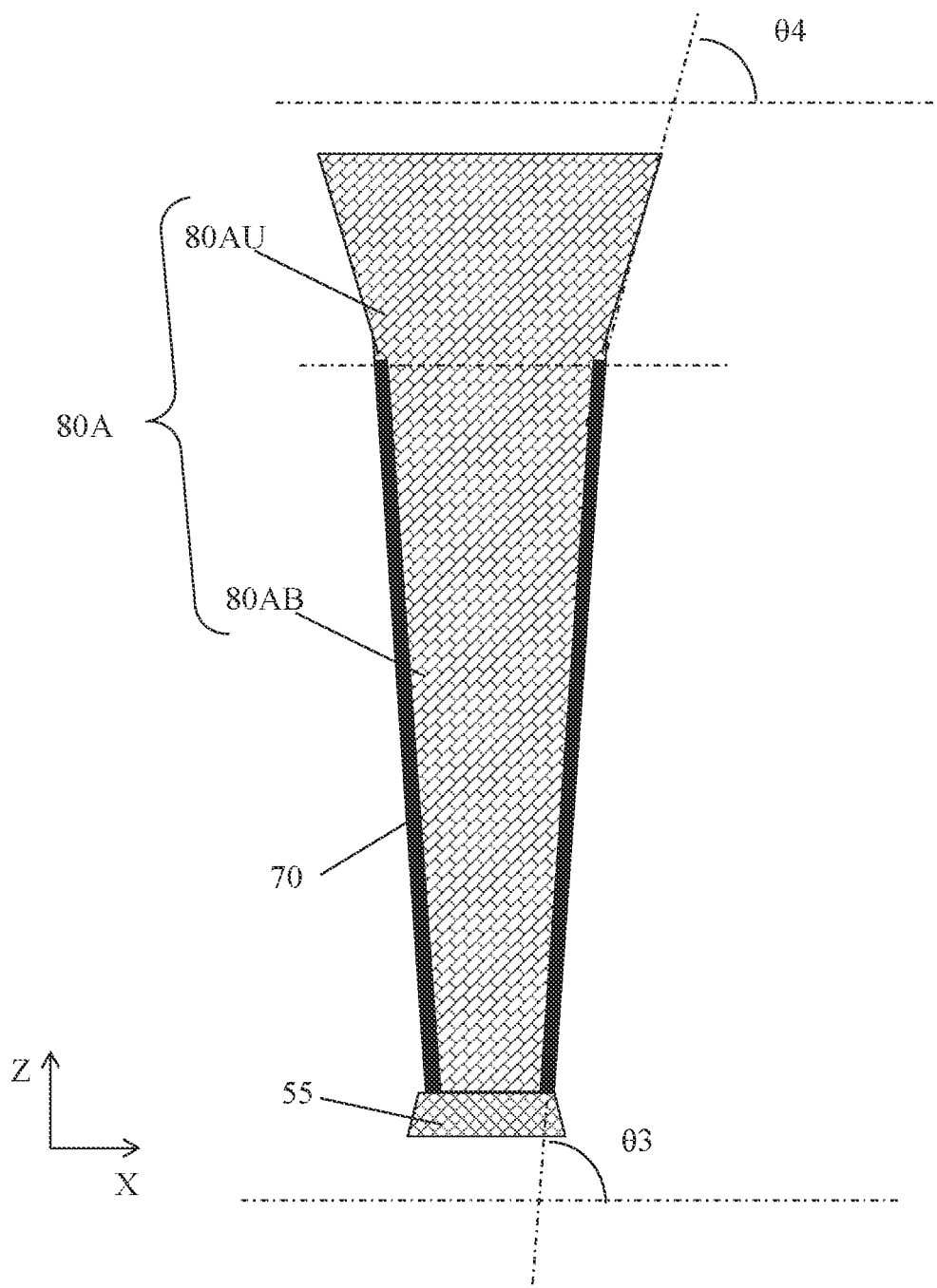
FIG. 18 shows a cross sectional view according to other embodiments of the present disclosure.

FIG. 18 shows a cross sectional view according to other embodiments of the present disclosure.

In some embodiments, due to the etching operation to remove the upper portion of the insulating liner layer 70, the second ILD layer 60 is also etched such that the upper portion of the contact openings 60A and 60B (see, FIG. 5) become wider. As a result, the contact 80A has a bottom portion 80AB and an upper portion 80AU, as shown in FIG. 18. The bottom portion 80AB is surrounded by the insulating liner layer 70, while the upper portion 80AU is not. The taper angle θ3 of the bottom portion 80AB is substantially the same as taper angles θ1 and θ2 (see, FIGS. 8 and 9). The taper angle θ4 of the upper portion 80AU is greater than the taper angles θ3, and is 75 degrees or more and less than 88 degrees in some embodiments.

Figure 19:
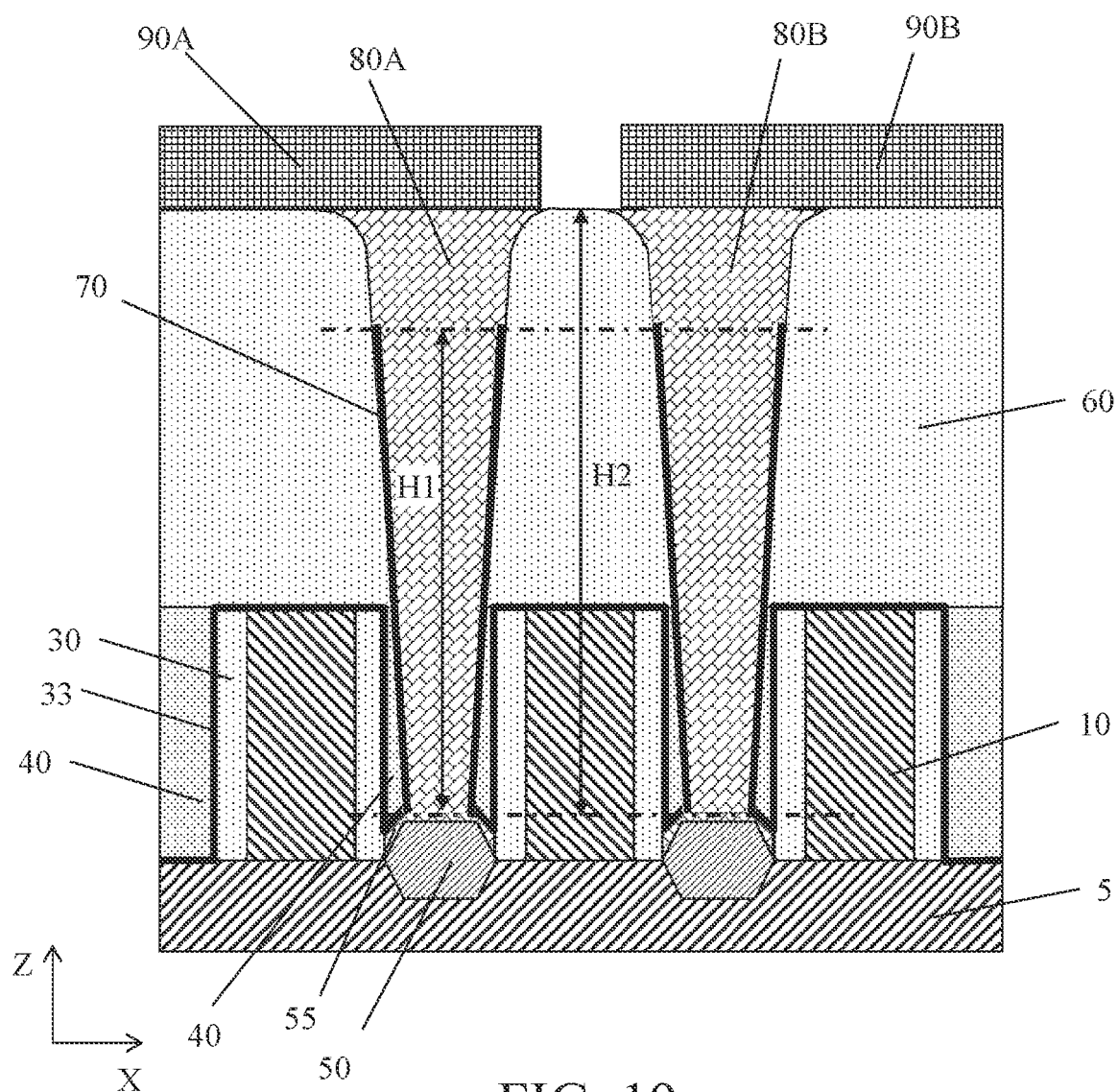
FIG. 19 shows a cross sectional view according to other embodiments of the present disclosure.

FIG. 19 shows a cross sectional view according to other embodiments of the present disclosure.

Due to the etching operation to remove the upper portion of the insulating liner layer 70, the second ILD layer 60 is also etched such that the upper portion of the contact openings 60A and 60B (see, FIG. 5) become rounded in some embodiments. As a result, upper portions of the contacts 80A and 80B have a funnel shape, as shown in FIG. 19. In such a case, the height H2 is measured between the level of the bottom of the contact 80A/80B and the highest portion of the second ILD layer 60 between two contacts 80A and 80B. As in the case of FIGS. 8 and 9, a height H1 of the insulating liner layer 70 measured from a top of the silicide layer 55 is less than 90% of a height H2, in some embodiments. In other embodiments, H1 is less than 75% of H2.

Figure 20:
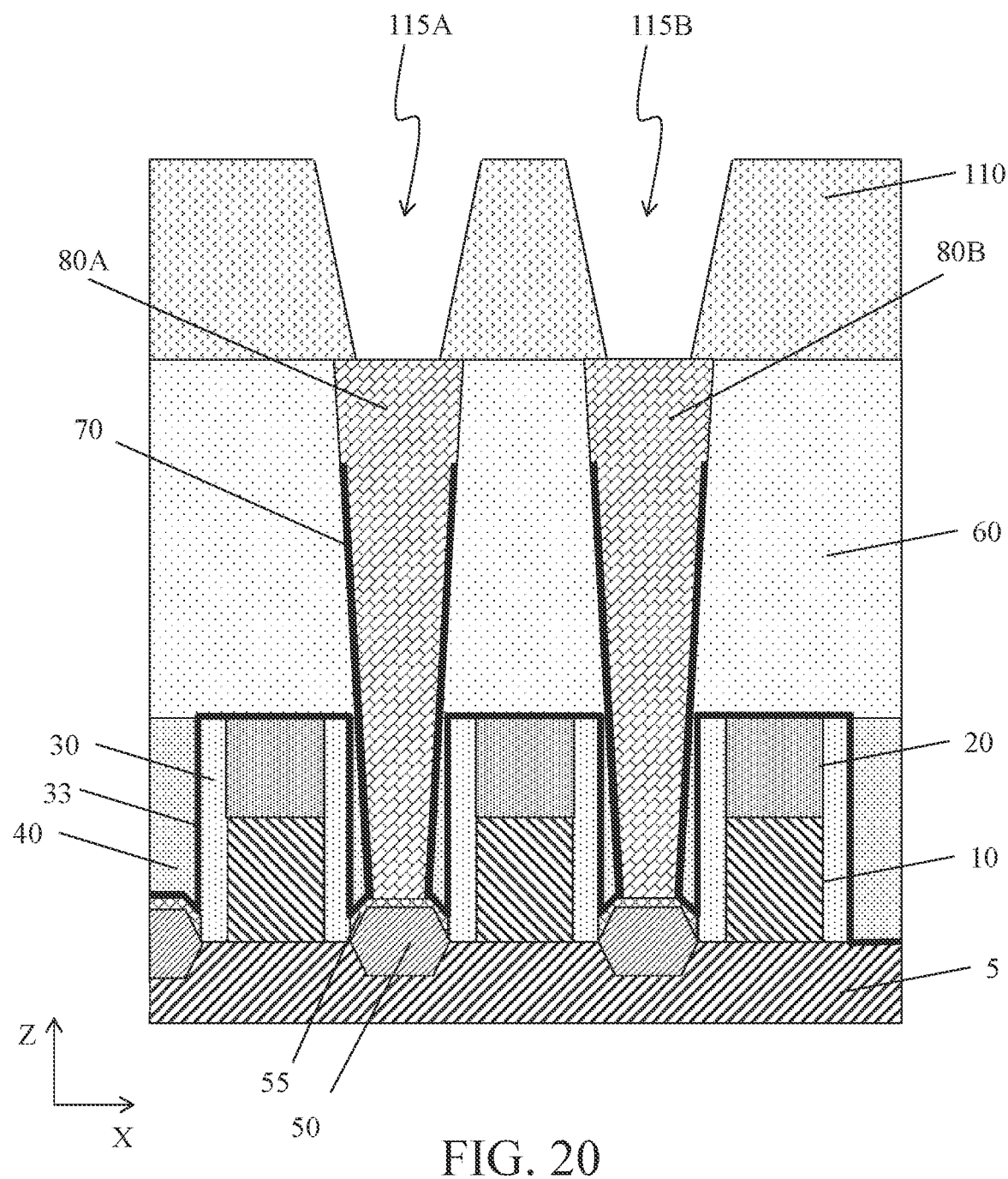
FIG. 20 shows a cross sectional view illustrating one of the various stages of a sequential semiconductor device fabrication process according to other embodiments of the present disclosure.
Figure 21:
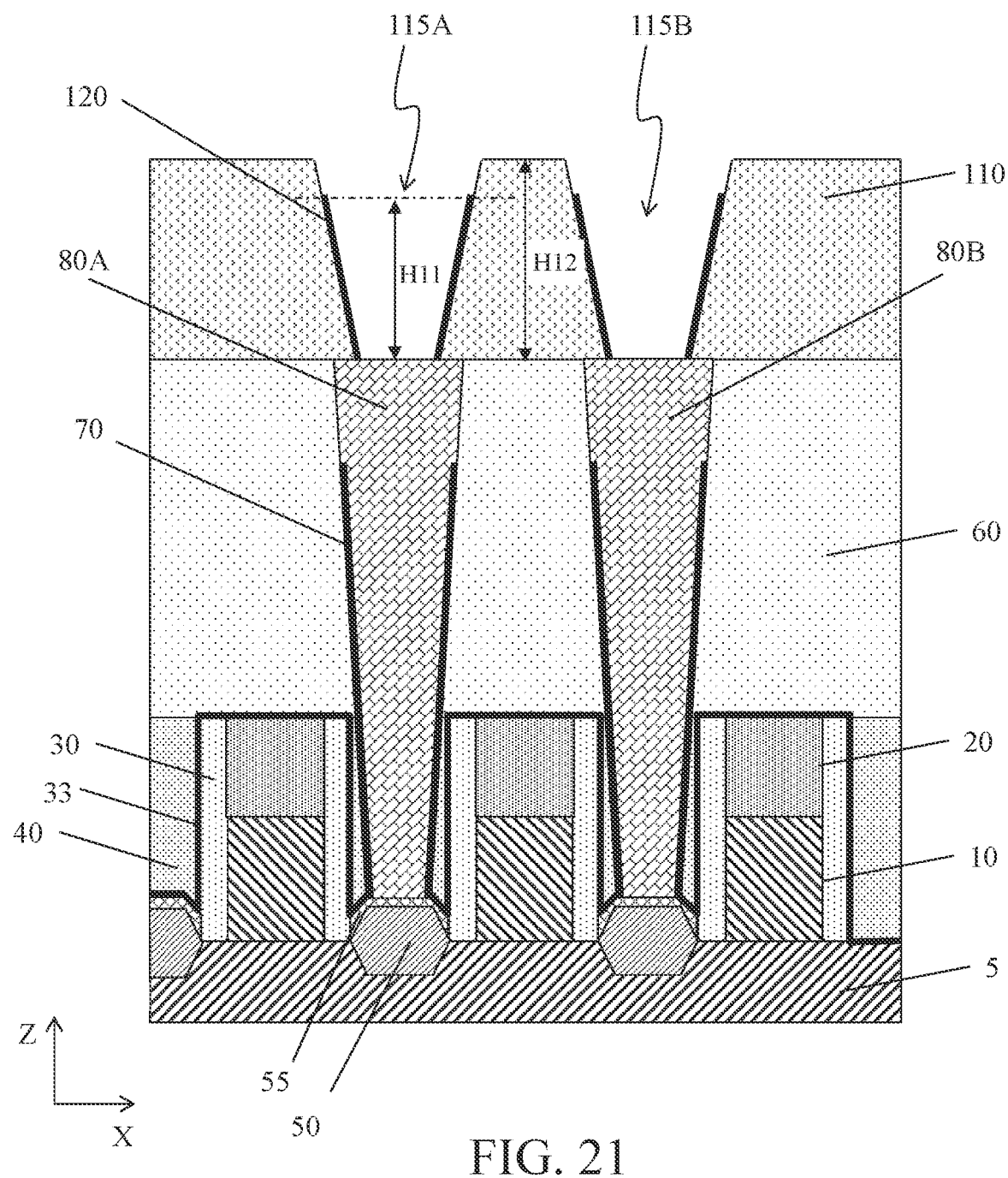
FIG. 21 shows a cross sectional view illustrating one of the various stages of a sequential semiconductor device fabrication process according to other embodiments of the present disclosure.
Figure 22:
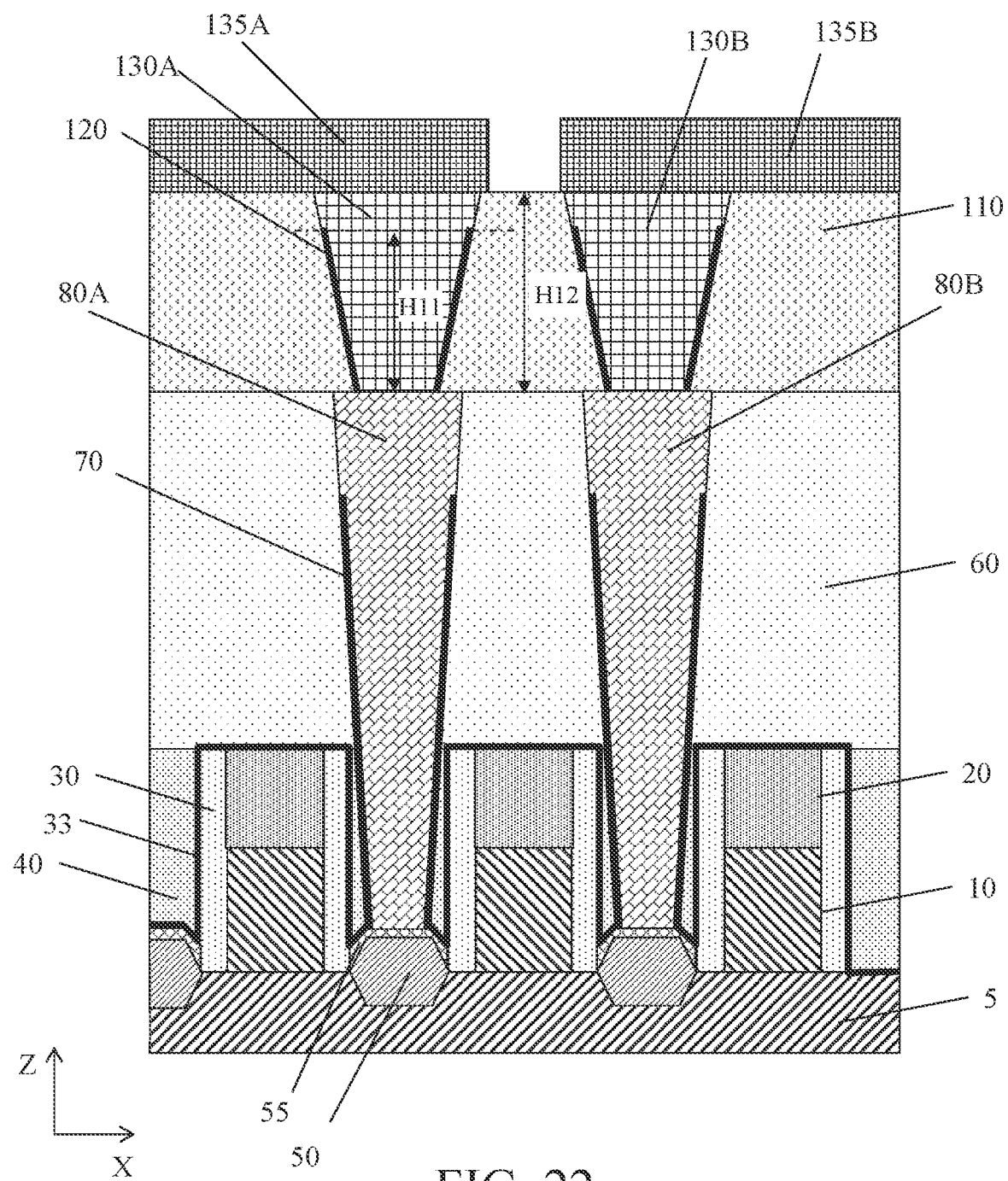
FIG. 22 shows a cross sectional view illustrating one of the various stages of a sequential semiconductor device fabrication process according to other embodiments of the present disclosure.

FIGS. 20-22 show a cross sectional view illustrating various stages of a sequential semiconductor device fabrication process according to other embodiments of the present disclosure. Material, configuration, dimensions and/or processes the same as or similar to the foregoing embodiments described with respect to FIGS. 1A-19 may be employed in the following embodiments, and detailed explanation thereof may be omitted.

After the structure shown in FIG. 7 is formed, a third ILD layer 110 is formed on the second ILD layer and the contacts 80A and 80B. The material and forming process of the third ILD layer 110 are similar to those of the first ILD layer 40 and the second ILD layer 60. Further, by using lithography and etching operations, second contact openings 115A and 115B are formed over the contacts 80A and 80B, respectively. In some embodiments, only one second contact opening is formed over one of the contacts 80A and 80B. Subsequently, by using operations similar to the operations described with respect to FIGS. 4 and 5, second insulating liner layers 120 are formed in the second contact openings 115A and 115B, as shown in FIG. 21. The material and forming process of the second insulating liner layer 120 are similar to those of the insulating liner layer 70. Then, by using operations similar to the operations described with FIGS. 6-8, second contacts 130A and 130B and upper wiring patterns 135A and 135B are formed, as shown in FIG. 22.

A height H11 of the second insulating liner layer 120 measured from a top of the contact 80A or 80B is less than 90% of a height H12 of the contact 130A or 130B measured between a level of the top of the contact 80A or 80B and a level of an interface between the third ILD layer 110 and the upper wiring pattern 135A or 135B, in some embodiments. In other embodiments, H11 is less than 75% of H12.

Figure 23:
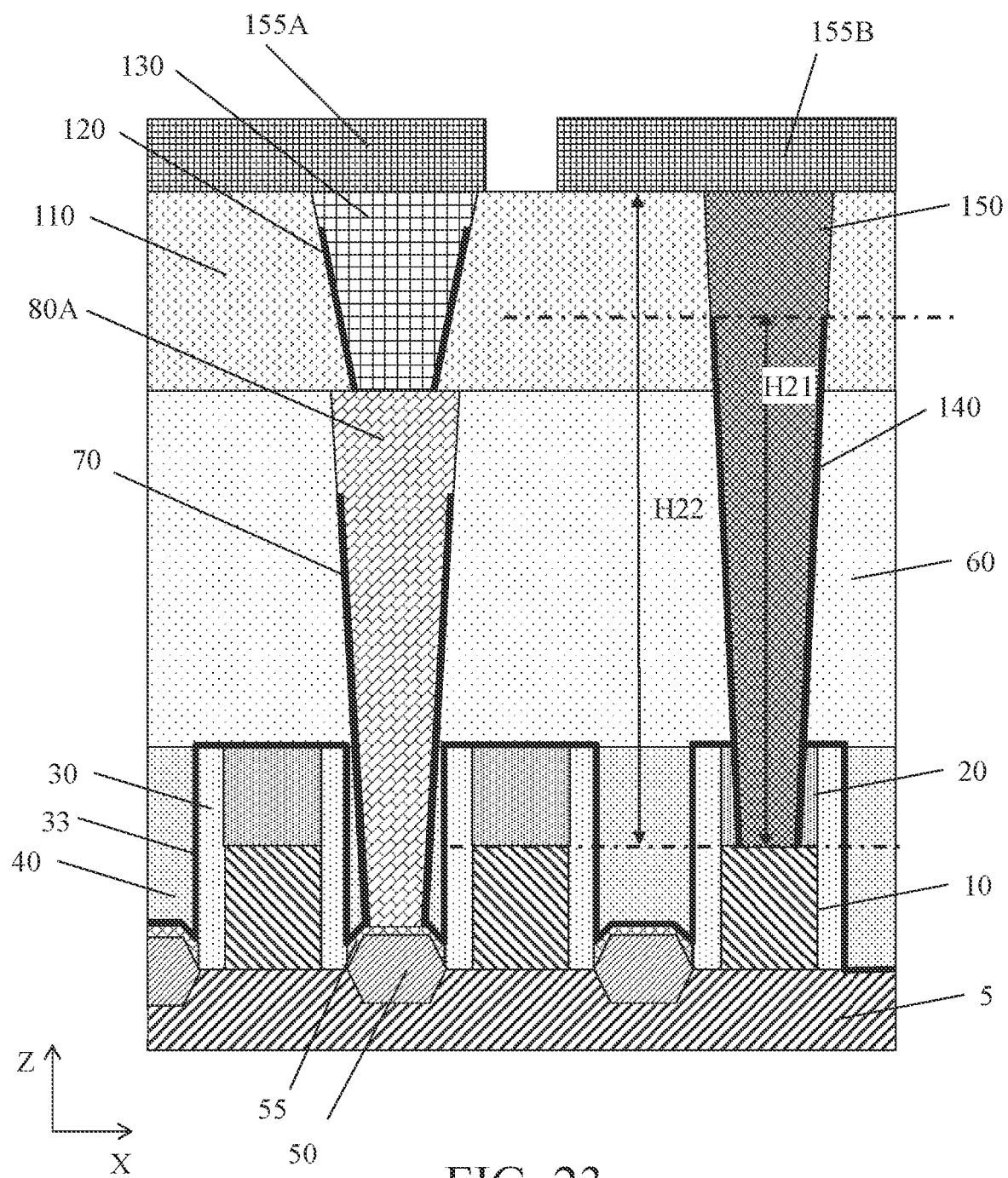
FIG. 23 shows a cross sectional view according to other embodiments of the present disclosure.

FIG. 23 shows a cross sectional view according to other embodiments of the present disclosure. Material, configuration, dimensions and/or processes the same as or similar to the foregoing embodiments described with respect to FIGS. 1A-22 may be employed in the following embodiments, and detailed explanation thereof may be omitted.

After the structure similar to FIG. 21 is formed, the second contact 130 is formed. Then, by using lithography and etching operations, a third contact opening is formed over the gate electrode 10 passing through the second and third ILD layers 60 and 110. By using operations similar to the operations described with FIGS. 4 and 5, third insulating liner layers 140 are formed in the third contact opening, and then conductive material is formed, thereby forming a third contact 150, as shown in FIG. 23. Then, upper wiring patterns 155A and 155B are formed in contact with the second contact 130 and the third contact 150, as shown in FIG. 23.

A height H21 of the third insulating liner layer 140 measured from a top of the contact metal gate 10 is less than 90% of a height H22 of the contact 150 measured between a level of the top of the metal gate 10 and a level of an interface between the third ILD layer 110 and the wiring pattern 155B, in some embodiments. In other embodiments, H21 is less than 75% of H22. In some embodiments, the cap insulating layers 20 are not disposed over the metal gates 10.

The various embodiments or examples described herein offer several advantages over the existing art. For example, by using an additional insulating liner layer in the contact, it is possible to improve electrical isolation between the contact and a gate or other conductive elements. Further, by removing the upper portion of the insulating liner layer, it is possible to reduce resistance of the contact because more conductive material can be filled in the contact openings than the case where no portion of the insulating liner layer is removed. In some embodiments, it is possible to reduce the resistance of the contact by about 10-30%.

It will be understood that not all advantages have been necessarily discussed herein, no particular advantage is required for all embodiments or examples, and other embodiments or examples may offer different advantages.

According to one aspect of the present disclosure, a semiconductor device includes a substrate provided with an electronic device, an interlayer dielectric (ILD) layer formed over the electronic device, a wiring pattern formed on the ILD layer and a contact formed in the ILD layer and physically and electrically connecting the wiring pattern to a conductive region of the electronic device. An insulating liner layer is provided on sidewalls of the contact between the contact and the ILD layer. A height of the insulating liner layer measured from a top of the conductive region of the electronic device is less than 90% of a height of the contact measured distance between the top of the conductive region and a level of an interface between the ILD layer and the wiring pattern.

According to another aspect of the present disclosure, a semiconductor device includes a substrate provided with an electronic device, an interlayer dielectric (ILD) layer formed over the electronic device, a first wiring pattern formed on the ILD layer, a second wiring pattern formed on the ILD layer, a first contact formed in the ILD layer and physically and electrically connecting the first wiring pattern to a first conductive region of the electronic device, and a second contact formed in the ILD layer adjacent to the first contact and physically and electrically connecting the second wiring pattern to a second conductive region of the electronic device. A first insulating liner layer is provided on sidewalls of the first contact between the contact and the ILD layer, and a second insulating liner layer is provided on sidewalls of the second contact between the contact and the ILD layer. A height of the first insulating liner layer measured from a top of the first conductive region of the electronic device is less than 90% of a height of the first contact measured between the top of the first conductive region and a level of an interface between the ILD layer and the first wiring pattern. A height of the second insulating liner layer measured from a top of the second conductive region of the electronic device is less than 90% of a height of the second contact measured between the top of the second conductive region and a level of an interface between the ILD layer and the second wiring pattern.

According to yet another aspect of the present disclosure, in a method of manufacturing a semiconductor device, an interlayer dielectric (ILD) layer is formed over a substrate provided with an electronic device, thereby covering the electronic device. A contact opening is formed in the ILD layer. An insulating liner layer is formed in the contact opening. An upper portion of the insulating liner layer formed in the contact opening is partially removed. After the upper portion of the insulating liner layer is removed, forming a conductive material in the opening so that the formed conductive material being in contact with a remaining insulating liner layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first conductive layer;
a dielectric layer disposed over the first conductive layer;
a conductive contact disposed in a contact hole formed in the dielectric layer, and physically and electrically connecting the first conductive layer,
wherein the contact hole has a tapered shape, wherein the tapered shape has a lower portion and an upper portion having a greater taper angle than the lower portion; and
a liner layer provided on a part of an inner wall of the contact hole between the conductive contact and the dielectric layer,
wherein a thickness of the liner layer decreases from a bottom to a top of the liner layer, and
wherein a part of the conductive contact is in contact with the dielectric layer.

2. The semiconductor device of claim 1, wherein no liner layer is disposed at the upper portion.

3. The semiconductor device of claim 1, wherein the liner layer is made of a different material than the dielectric layer and the conductive contact.

4. The semiconductor device of claim 3, wherein the liner layer is made of one or more layers of SiN, SiC, SiOCN, SiCN, SiON or SiOC.

5. The semiconductor device of claim 1, wherein:
the dielectric layer includes a first dielectric layer and a second dielectric layer disposed over the first dielectric layer, and
the liner layer and the conductive contact are in direct contact with the second dielectric layer.

6. The semiconductor device of claim 5, wherein the conductive contact is separated by the liner layer from the first dielectric layer.

7. A semiconductor device, comprising:
a first conductive layer disposed over a substrate;
a first interlayer dielectric (ILD) layer disposed over the substrate;
a first conductive contact disposed in a first contact hole formed in the first ILD layer and being in contact with the first conductive layer;
a first liner layer provided on a part of an inner wall of the first contact hole between the first conductive contact and the first ILD layer;
a second ILD layer disposed over the first ILD layer;
a second conductive contact disposed in a second contact hole formed in the second ILD layer and being in contact with the first conductive contact; and
a second liner layer provided on a part of an inner wall of the second contact hole between the second conductive contact and the second ILD layer,
wherein a part of the inner wall of the first contact hole is not covered by the first liner layer.

8. The semiconductor device of claim 7, wherein a part of the inner wall of the second contact hole is not covered by the second liner layer.

9. The semiconductor device of claim 7, wherein the second conductive contact has a tapered shape.

10. The semiconductor device of claim 9, wherein a bottom of the second conductive contact is greater in area than a top of the first conductive contact.

11. The semiconductor device of claim 8, further comprising:
a second conductive layer disposed over the substrate;
a third conductive contact disposed in a third contact hole formed in the second ILD layer and the first ILD layer and being in contact with the second conductive contact; and
a third liner layer provided on a part of an inner wall of the third contact hole between the third conductive contact and the second ILD layer and the first ILD layer,
wherein a part of the inner wall of the third contact hole is not covered by the third liner layer.

12. The semiconductor device of claim 11, wherein the third layer is in contact with the second ILD layer.

13. The semiconductor device of claim 11, wherein a top of the third liner layer is located at a different level than a top of the second liner layer and a top of the first liner layer.

14. The semiconductor device of claim 11, wherein the first, second and third liner layers are made of one or more layers of SiN, SiC, SiOCN, SiCN, SiON or SiOC.

15. A semiconductor device, comprising:
a conductive layer disposed over a substrate;
an interlayer dielectric (ILD) layer formed over the substrate;
a conductive contact formed in the ILD layer and in contact with the conductive layer; and
a liner layer provided on a lower part of a sidewall of the conductive contact between the conductive contact and the ILD layer,
wherein an upper part of the sidewall of the conductive contact is in contact with the ILD layer, and has a funnel shape, and
wherein the funnel shape has a lower portion and an upper portion having a greater taper angle than the lower portion.

16. The semiconductor device of claim 15, wherein the liner layer is made of a different material than the ILD layer.

17. The semiconductor device of claim 16, wherein the liner layer is made of silicon nitride.

18. The semiconductor device of claim 15, wherein no liner layer is provided on an upper part of the sidewall of the conductive contact.

19. The semiconductor device of claim 15, wherein the liner layer is made of one or more layers of SiC, SiOCN, SiCN, SiON, or SiOC.

20. The semiconductor device of claim 15, wherein the ILD is made of $SiO_2$, SiOC, SiOCN, or SiCN.

* * * * *